US 8,504,895 B2

(12) United States Patent
Sharon et al.

(10) Patent No.: US 8,504,895 B2
(45) Date of Patent: Aug. 6, 2013

(54) USING DAMPING FACTORS TO OVERCOME LDPC TRAPPING SETS

(75) Inventors: Eran Sharon, Rishon Lezion (IL); Simon Litsyn, Giv'at Shmuel (IL); Idan Alrod, Herzliya (IL)

(73) Assignee: Ramot At Tel Aviv University Ltd., Tel Aviv (IL)

( * ) Notice: Subject to any disclaimer, the term of this patent is extended or adjusted under 35 U.S.C. 154(b) by 988 days.

(21) Appl. No.: 12/489,576

(22) Filed: Jun. 23, 2009

(65) Prior Publication Data

US 2009/0319861 A1 Dec. 24, 2009

Related U.S. Application Data

(60) Provisional application No. 61/074,706, filed on Jun. 23, 2008.

(51) Int. Cl.
*G11C 29/00* (2006.01)
(52) U.S. Cl.
USPC .......................... 714/763; 714/780; 714/796
(58) Field of Classification Search
USPC ................. 714/763, 752, 758, 780, 760, 796, 714/800
See application file for complete search history.

(56) References Cited

U.S. PATENT DOCUMENTS

| | | | | |
|---|---|---|---|---|
| 4,295,218 A | * | 10/1981 | Tanner | 714/762 |
| 7,343,548 B2 | * | 3/2008 | Blankenship et al. | 714/800 |
| 7,552,097 B2 | * | 6/2009 | Richardson et al. | 706/15 |
| 7,673,223 B2 | * | 3/2010 | Richardson et al. | 714/780 |
| 2005/0193320 A1 | | 9/2005 | Varnica et al. | |
| 2007/0033497 A1 | * | 2/2007 | Shen et al. | 714/784 |
| 2007/0234184 A1 | | 10/2007 | Richardson | |
| 2008/0148128 A1 | | 6/2008 | Sharon et al. | |
| 2008/0294970 A1 | * | 11/2008 | Gross et al. | 714/801 |

FOREIGN PATENT DOCUMENTS

| | | |
|---|---|---|
| EP | 1612948 | 1/2006 |
| EP | 1909394 | 4/2008 |

OTHER PUBLICATIONS

Stefan Landner, Thorsten Hem, Olgica Milenkovic, Johannes B. Huber, "Two Methods for Reducing the Error-Floor of LDPC Codes", University of Colorado, Boulder, CO, USA, University of Erlangen-Nuremberg, Erlangen, arXiv cs.IT/0701006v1, Dec. 30, 2006, pp. 1-50.
Eran Sharon, Simon Litsyn, Senior Member, IEEE, Jacob Goldberger, "Efficient Serial Message-Passing Schedules for LDPC Decoding" IEEE Transactions on Information Theory, vol. 53, No. 11, Nov. 2007, pp. 1-17.

(Continued)

*Primary Examiner* — Fritz Alphonse
(74) *Attorney, Agent, or Firm* — Alston & Bird LLP

(57) ABSTRACT

To decode a representation, imported from a channel, of a codeword that encodes K information bits as N>K codeword bits, estimates of the codeword bits are updated by exchanging messages between N bit nodes and N−K check nodes of a graph in a plurality of iterations. In each of one or more of the iterations, some or all values associated with the bit nodes, and/or some or all values associated with check nodes, and/or some or all messages are modified in a manner that depends explicitly on the ordinality of the iteration and is independent of any other iteration. Alternatively, the modifications are according to respective locally heteromorphic rules.

51 Claims, 13 Drawing Sheets

OTHER PUBLICATIONS

Hua Xiao and Amir H. Banihashemi, Member, IEEE, GrapBased Message-Passing Schedules for Decoding LDPC Codes, IEEE Transactions on Communications, vol. 52, No. 12, Dec. 2004, pp. 2098-2105.

International Search Report and Written Opinion for Application No. PCT/IB2009/052662 dated Dec. 7, 2009.

International Preliminary Report on Patentability for PCT/IB2009/052662 dated Jan. 5, 2011.

Casado, A. I. V. et al., *Improving LDPC Decoders via Informed Dynamic Scheduling*, ITW 2007, Lake Tahoe, CA, Sep. 2-6, 2007 pp. 208-213

Di, C. et al., *Finite-Length Analysis of Low-Density Parity-check Codes on the Binary Erasure Channel*, IEEE Trans. Inform. Theory, vol. 48, No. 6, Jun. 2002, pp. 1570-1579.

Frey, B. J. et al., *Signal-Space Characterization of Iterative Decoding*, IEEE Trans. Inform. Theory, vol. 47, No. 2, Feb. 2001, pp. 766-781.

Gallager, R. G., *Low-Density Parity-Check Codes*, Cambridge, MA: MIT Press 1963.

McKay, D. J. C. et al., *Weakness of Margulis and Ramanujan-Margulis Low-Density Partiy Check Codes*, Electronic Notes in Theoretical Computer Science, vol. 74 (2003), 8 pages.

Han, Y. et al., *LDPC Decoder Strategies for Achieving Low Error Floors*, University of Arizona, Information Theory and Applications Workshop (2008) 1-10.

Richardson, T., *Error Floors of LPDC Codes*, Flarion Technologies, Proceedings of the Annual Allerton Conference on Communication Control and Computing 41(3), (2003) 1426-1435.

\* cited by examiner

Initialization:
for all $c \in C, v \in N(c,G)$     $R_{cv} \leftarrow 0$

Iteration:
for all $v \in V$     (Compute bit to check messages)
    for all $c \in N(v,G)$
$$Q_{vc} \leftarrow P_v + \sum_{c' \in N(v,G) \setminus c} R_{c'v}$$
    end of loop
end of loop
for all $c \in C$     (Compute check to bit messages)
    for all $v \in N(c,G)$
$$R_{cv} \leftarrow \varphi^{-1}\left( \sum_{v' \in N(c,G) \setminus v} \varphi(Q_{v'c}) \right)$$
    end of loop
end of loop
for all $v \in V$     (update final bit estimates)
$$Q_v \leftarrow P_v + \sum_{c \in N(v,G)} R_{cv}$$
end of loop

Stop Criteria:
for all $v \in V$   $\hat{v} = sign(Q_v)$
if $H \cdot \underline{\hat{v}} = 0$, stop
*else, continue to next iteration*

FIGURE 2 (PRIOR ART)

Initialization:
for all $v \in V, c \in C \quad R_{cv} \leftarrow 0$
for all $v \in V \quad\quad\quad Q_v \leftarrow P_v$

Iteration:
for all $c \in C$                        (Serially traversing the check nodes)

$\quad S \leftarrow \sum_{v \in N(c,G)} \varphi(Q_v - R_{cv})$ $\quad$ for all $v \in N(c, G)$ $\quad\quad Q_{vc} \leftarrow Q_v - R_{cv}$       (Sending $Q_{vc}$ messages into the check nodes)

$\quad\quad R_{cv} \leftarrow \varphi^{-1}(S - \varphi(Q_{vc}))$   (Sending $R_{cv}$ messages out from the check nodes)

$\quad\quad Q_v \leftarrow Q_{vc} + R_{cv}$        (updating *a-posteriori* LLRs)

$\quad$ end of loop
end of loop

Stop Criteria:
for all $v \in V \quad \hat{v} = sign(Q_v)$
*if* $H \cdot \hat{v} = 0$, stop
*else, continue to next iteration*

FIGURE 3 (PRIOR ART)

Decoding phases:

for all $c \in C_J, v \in N(c,G)$: $Q_{vc} = P_v$ for all $i \in \{1,\ldots,t\}$:  (go over sub-graphs)

Sub-graph initialization:
  for all $v \in V_i, c \in C_i$:    $R_{cv} \leftarrow 0$
  for all $v \in V_i$:          $Q_v \leftarrow P_v = function(y_v)$
  for all $v \in V_i, c \in C_J$:   $R_{cv} \leftarrow \varphi^{-1}\left(\sum_{v' \in N(c,G)\backslash v} \varphi(Q_{v'c})\right)$  (exchange inter sub-graph information)

Sub-graph $(i)$ iterations:
  for all $c \in C_i$:  (go over sub-graph check nodes)
    Check node processing (send messages to and from check node):
    $S \leftarrow \sum_{v \in N(c,G_i)} \varphi(Q_v - R_{cv})$
    for all $v \in N(c,G_i)$:
      $Q_{temp} \leftarrow Q_v - R_{cv}$
      $R_{cv} \leftarrow \varphi^{-1}(S - \varphi(Q_{temp}))$
      $Q_v \leftarrow Q_{temp} + R_{cv}$
    end of loop
  end of check nodes loop
end of iteration loop
Sub-Graph Stop Criteria:
for all $v \in V_i$: $\hat{v} = sign(Q_v)$
if $H_i \cdot \hat{v} = 0$ or maximal number of iterations is reached, stop
$H_i$ ☐ the parity-check matrix corresponding to sub-graph $G_i$
else, continue to next iteration
Sub-graph termination:
  for all $v \in V_i, c \in C_J$:   $Q_{vc} \leftarrow P_v + \sum_{c' \in N(v,G)\backslash c} R_{c'v}$  (exchange inter sub-graph information)
end of sub-graphs loop

Stop Criteria:
for all $v \in V$ $\hat{v} = sign(Q_v)$
if $H \cdot \hat{v} = 0$ or maximal number of phases, then stop
$H$ ☐ the parity-check matrix corresponding to graph $G$
else, continue to next phase
end of phases loop

FIGURE 6

USING DAMPING FACTORS TO OVERCOME LDPC TRAPPING SETS

This patent application claims the benefit of U.S. Provisional Patent Application No. 61/074,706, filed Jun. 23, 2008

FIELD AND BACKGROUND OF THE INVENTION

Disclosed herein is a method and associated devices, for Low-Density Parity Check (LDPC) decoding, that overcome non-convergence due to trapping sets.

Error Correction Codes (ECCs) are commonly used in communication systems and in storage systems. Various physical phenomena occurring both in communication channels and in storage devices result in noise effects that corrupt the communicated or stored information. Error correction coding schemes can be used for protecting the communicated or stored information against the resulting errors. This is done by encoding the information before transmission through the communication channel or storage in the memory device. The encoding process transforms the information bits sequence into a codeword by adding redundancy to the information. This redundancy can then be used in order to recover the information from the possibly corrupted codeword through a decoding process.

In both communication systems and storage systems an information bit sequence $\underline{i}$ is encoded into a coded bit sequence $\underline{v}$ that is modulated or mapped into a sequence of symbols $\underline{x}$ that is adapted to the communication channel or to the memory device. At the output of the communication channel or memory device a sequence of symbols $\underline{y}$ is obtained. An ECC decoder of the system decodes the sequence $\underline{y}$ and recovers the bit sequence $\hat{\underline{i}}$, which should reconstruct the original information bit sequence $\underline{i}$ with high probability.

A common ECC family is the family of linear binary block codes. A length N linear binary block code of dimension K is a linear mapping of length K information bit sequences into length N codewords, where N>K. The rate of the code is defined as R=K/N. The encoding process of a codeword $\underline{v}$ of dimension 1×N is usually done by multiplying the information bits sequence $\underline{i}$ of dimension 1×K by a generator matrix G of dimension K×N and rank K according to $$\underline{v} = \underline{i} \cdot G \qquad (1)$$

It is also customary to define a parity-check matrix H of dimension M×N and rank M, where M=N−K. The parity-check matrix is related to the generator matrix through the following equation:

$$GH^T = 0 \qquad (2)$$

The parity-check matrix can be used in order to check whether a length N binary vector is a valid codeword. A 1×N binary vector $\underline{v}$ belongs to the code if and only if the following equation holds:

$$H \cdot \underline{v}' = 0 \qquad (3)$$

(In equation (3), the prime on $\underline{v}'$ means that $\underline{v}'$ is a column vector.)

In recent years iterative coding schemes have become very popular. In these schemes the code is constructed as a concatenation of several simple constituent codes and is decoded using an iterative decoding algorithm by exchanging information between the constituent decoders of the simple codes. Usually, the code can be defined using a bipartite graph describing the interconnections between the constituent codes. In this case, decoding can be viewed as an iterative message passing over the graph edges.

A popular class of iterative codes is Low-Density Parity-Check (LDPC) codes. An LDPC code is a linear binary block code defined by a sparse parity-check matrix H. As shown in FIG. 1, the code can be defined equivalently by a sparse bipartite "(Tanner" graph G=(V,C,E) with a set V of N bit nodes (N=13 in FIG. 1), a set C of M check nodes (M=10 in FIG. 1) and a set E of edges (E=38 in FIG. 1) connecting bit nodes to check nodes. The bit nodes correspond to the codeword bits and the check nodes correspond to parity-check constraints on the bits. A bit node is connected by edges to the check nodes that the bit node participates with. In the matrix representation of the code on the left side of FIG. 1 an edge connecting bit node i with check node j is depicted by a non-zero matrix element at the intersection of row j and column i.

Next to the first and last check nodes of FIG. 1 are shown the equivalent rows of equation (3). The symbol "⊕" means "XOR".

LDPC codes can be decoded using iterative message passing decoding algorithms. These algorithms operate by exchanging messages between bit nodes and check nodes along the edges of the underlying bipartite graph that represents the code. The decoder is provided with initial estimates of the codeword bits (based on the communication channel output or based on the read memory content). These initial estimates are refined and improved by imposing the parity-check constraints that the bits should satisfy as a valid codeword (according to equation (3)). This is done by exchanging information between the bit nodes representing the codeword bits and the check nodes representing parity-check constraints on the codeword bits, using the messages that are passed along the graph edges.

In iterative decoding algorithms, it is common to utilize "soft" bit estimations, which convey both the bit estimations and the reliabilities of the bit estimations.

The bit estimations conveyed by the messages passed along the graph edges can be expressed in various forms. A common measure for expressing a "soft" bit estimation is as a Log-Likelihood Ratio (LLR)

$$\log \frac{Pr(v = 0 \mid \text{current constraints and observations})}{Pr(v = 1 \mid \text{current constraints and observations})},$$

where the "current constraints and observations" are the various parity-check constraints taken into account in computing the message at hand and the observations $\underline{y}$ corresponding to the bits participating in these parity checks. Without loss of generality, for simplicity we assume hereinafter that LLR messages are used throughout. The sign of the LLR provides the bit estimation (i.e., positive LLR corresponds to v=0 and negative LLR corresponds to v=1). The magnitude of the LLR provides the reliability of the estimation (i.e. |LLR|=0 means that the estimation is completely unreliable and |LLR|=∞ means that the estimation is thought to be completely reliable and the bit value is thought to be known).

Usually, the messages passed during the decoding along the graph edges between bit nodes and check nodes are extrinsic. An extrinsic message m passed from a node n on an edge e takes into account all the values received on edges connected to n other than edge e (this is why the message is called extrinsic: it is based only on new information).

One example of a message passing decoding algorithm is the Belief-Propagation (BP) algorithm, which is considered to be the best algorithm from among this family of message passing algorithms.

Let $$P_v = \log\frac{Pr(v=0\mid y)}{Pr(v=1\mid y)}$$

denote the initial decoder estimation for bit v, based only on the received or read symbol y. Note that it is also possible that some of the bits are not transmitted through the communication channel or stored in the memory device, hence there is no y observation for these bits. In this case, there are two possibilities: 1) shortened bits—the bits are known a-priori and $P_v = \pm\infty$ (depending on whether the bit is 0 or 1). 2) punctured bits—the bits are unknown a-priori and $$P_v = \log\frac{Pr(v=0)}{Pr(v=1)},$$

where Pr(v=0) and Pr(v=1) are the a-priori probabilities that the bit v is 0 or 1 respectively. Assuming the information bits have equal a-priori probabilities to be 0 or 1 and assuming the code is linear then $$P_v = \log\frac{1/2}{1/2} = 0.$$

Let $$Q_v = \log\frac{Pr(v=0\mid \underline{y},\,H\cdot\underline{v}=0)}{Pr(v=1\mid \underline{y},\,H\cdot\underline{v}=0)}$$

denote the final decoder estimation for bit v, based on the entire received or read sequence $\underline{y}$ and assuming that bit v is part of a codeword (i.e., assuming $H\cdot\underline{v}=0$).

Let $Q_{vc}$ denote a message from bit node V to check node c. Let $R_{cv}$ denote a message from check node c to bit node v.

The BP algorithm utilizes the following update rules for computing the messages:

The bit node to check node computation rule is:

$$Q_{vc} = P_v + \sum_{c'\in N(v,G)\backslash c} R_{c'v} \qquad (4)$$

Here, N(n,G) denotes the set of neighbors of a node n in the graph G and c'∈N(v,G)\c refers to those neighbors excluding node 'c' (the summation is over all neighbors except c).

The check node to bit node computation rule is:

$$R_{cv} = \varphi^{-1}\left(\sum_{v'\in N(c,G)\backslash v} \varphi(Q_{v'c})\right) \qquad (5)$$

Here $$\varphi(x) = \left\{\text{sign}(x),\, -\log\tanh\!\left(\frac{|x|}{2}\right)\right\}$$

and operations in the φ domain are done over the group $\{0,1\}\times R^+$ (this basically means that the summation here is defined as summation over the magnitudes and XOR over the signs). Analogous to the notation of equation (4), N(c,G) denotes the set of bit node neighbors of a check node c in the graph G and v'∈N(c,G)\v refers to those neighbors excluding node 'v' (the summation is over all neighbors except v).

The final decoder estimation for bit v is:

$$Q_v = P_v + \sum_{c'\in N(v,G)} R_{c'v} \qquad (6)$$

The order of passing messages during message passing decoding is called the decoding schedule. BP decoding does not imply utilizing a specific schedule—it only defines the computation rules (equations (4), (5) and (6)). The decoding schedule does not affect the expected error correction capability of the code. However, the decoding schedule can significantly influence the convergence rate of the decoder and the complexity of the decoder.

The standard message-passing schedule for decoding LDPC code is the flooding schedule, in which in each iteration all the variable nodes, and subsequently all the check nodes, pass new messages to their neighbors (R. G. Gallager, *Low-Density Parity-Check Codes*, Cambridge, Mass.: MIT Press 1963). The standard BP algorithm based on the flooding schedule is given in FIG. 2.

The standard implementation of the BP algorithm based on the flooding schedule is expensive in terms of memory requirements. We need to store a total of 2|V|+2|E| messages (for storing the $P_v$, $Q_v$, $Q_{vc}$ and $R_{cv}$ messages). Moreover, the flooding schedule exhibits a low convergence rate and hence requires higher decoding logic (e.g., more processors on an ASIC) for providing a required error correction capability at a given decoding throughput.

More efficient, serial message passing decoding schedules, are known. In a serial message passing schedule, the bit or check nodes are serially traversed and for each node, the corresponding messages are sent into and out from the node. For example, a serial schedule can be implemented by serially traversing the check nodes in the graph in some order and for each check node c∈C the following messages are sent:

1. $Q_{vc}$ for each v∈N(c) (i.e., all $Q_{vc}$ messages into the node c)

2. $R_{cv}$ for each v∈N(c) (i.e., all $R_{cv}$ messages from node c)

Serial schedules, in contrast to the flooding schedule, enable immediate and faster propagation of information on the graph resulting in faster convergence (approximately two times faster). Moreover, serial schedule can be efficiently implemented with a significant reduction of memory requirements. This can be achieved by using the $Q_v$ messages and the $R_{cv}$ messages in order to compute the $Q_{vc}$ messages on the fly, thus avoiding the need to use an additional memory for storing the $Q_{vc}$ messages. This is done by expressing $Q_{vc}$ as $(Q_v - R_{cv})$ based on equations (4) and (6). Furthermore, the same memory as is initialized with the a-priori messages $P_v$ is used for storing the iteratively updated $Q_v$ a-posteriori messages. An additional reduction in memory requirements is obtained because in the serial schedule we only need to use the knowledge of N(c) ∀c∈C, while in the standard implementation of the flooding schedule we use both data structures N(c) ∀c∈C and N(v) ∀v∈V requiring twice as much memory for storing the code's graph structure. The serially scheduled decoding algorithm appears in FIG. 3.

To summarize, serial decoding schedules have the following advantages over the flooding schedule:
1) Serial decoding schedules speed up the convergence by a factor of 2 compared to the standard flooding schedule. This means that we need only half the decoder logic in order to provide a given error correction capability at a given throughput, compared to a decoder based on the flooding schedule.
2) Serial decoding schedules provide a memory-efficient implementation of the decoder. A RAM for storing only |V|+|E| messages is needed (instead of for storing 2|V|+ 2|E| messages as in the standard flooding schedule). Half the ROM size for storing the code's graph structure is needed compared to the standard flooding schedule.
3) "On-the-fly" convergence testing can be implemented as part of the computations done during an iteration, allowing convergence detection during an iteration and decoding termination at any point. This can save on decoding time and energy consumption.

Definitions

The methods described herein are applicable to correcting errors in data in at least two different circumstances. One circumstance is that in which data are retrieved from a storage medium. The other circumstance is that in which data are received from a transmission medium. Both a storage medium and a transmission medium are special cases of a "channel" that adds errors to the data. The concepts of "retrieving" and "receiving" data are generalized herein to the concept of "importing" data. Both "retrieving" data and "receiving" data are special cases of "importing" data from a channel.

The data that are decoded by the methods presented herein are a representation of a codeword. The data are only a "representation" of the codeword, and not the codeword itself, because the codeword might have been corrupted by noise in the channel before one of the methods is applied for decoding.

The definition of the second general method described herein requires the definition of "locally homomorphic" rules for modifying values at nodes and at edges and "locally heteromorphic" rules for modifying values at nodes and at edges. A rule is "locally homomorphic" if, starting from the rule for modifying a value associated with a given bit node or with a given check node or with a given edge, if the value(s) associated specifically with that bit node or with that check node or with that edge are swapped for the value(s) specifically associated with a different bit node or check node or edge, then the rule for modifying the corresponding value of the other bit node or check node is obtained. (In the preferred embodiment described below, the values specifically associated with a bit node v are $P_v$, $S_v$ and the set of messages $Q_{vc}$ and $R_{cv}$; the values specifically associated with a check node c are $T_c$ and the set of messages $Q_{vc}$ and $R_{cv}$; and the values specifically associated with an edge that connects a bit node v to a check node c are the two messages $Q_{vc}$ and $R_{cv}$.) For example, equation (4) is a locally homomorphic rule for replacing the bit-node-to-check-node message value $Q_{vc}$ of one iteration with the $Q_{vc}$ of the next iteration. This rule is locally homomorphic because if the initial estimate value $P_v$ and the check-node-to-bit-node values $R_{cv}$ that go into computing $Q_{vc}$ are swapped for the corresponding values associated with a different edge, then the corresponding replacement rule for that edge is obtained. By contrast, in the preferred embodiment described below, the rule for replacing the bit-node-to-check-node message value $Q_{vc}$ of one iteration with the $Q_{vc}$ of the next iteration is either $$Q_{vc} = P_v + \alpha_e^l \sum_{c' \in N(v,G) \setminus c} R_{c'v} \text{ or } Q_{vc} = \alpha_e^l \left( P_v + \sum_{c' \in N(v,G) \setminus c} R_{c'v} \right).$$

This rule is locally heteromorphic because if the initial estimate value $P_v$ and the check-node-to-bit-node values $R_{cv}$ that go into computing $Q_{vc}$ are swapped for the corresponding values associated with a different edge, then the corresponding replacement rule for that edge is not obtained unless the two damping factors $\alpha_e^l$ are coincidentally equal.

SUMMARY OF THE INVENTION

Iterative coding systems exhibit an undesired effect called error floor as shown in FIG. 4, where, below a certain "noise" level in the communication channel or in the memory device, the Block Error Rate (BER) at the output of the decoder starts to decrease much more slowly even though the "noise" that is responsible for the bit errors becomes smaller. This effect is problematic, especially in storage systems, where the required decoder output block error rate should be very small ($\sim 10^{-10}$). Note that in FIG. 4 the noise increases to the right.

It is well known that the error correction capability and the error floor of an iterative coding system improve as the code length increases (this is true for any ECC system, but especially for iterative coding systems, in which the error correction capability is rather poor at short code lengths).

However, in conventional implementations of iterative coding systems, the memory complexity of the decoding hardware is proportional to the code length; hence using long codes incurs high complexity, even in the most efficient implementations known (e.g. serially scheduled decoders).

Therefore, presented herein are methods for implementing extremely long LDPC codes that provide very low error floor and near optimal error correction capability, using low complexity decoding hardware.

While properly designed LDPC codes are very powerful, and can correct a large number of errors in a code word, a phenomenon known as "trapping sets" may cause the decoder to fail, and increase the error floor of the code, even though the number of incorrect bits may be very small and may be confined to certain regions in the graph. Trapping sets are not well defined for general LDPC codes, but have been described as: "These are sets with a relatively small number of variable nodes such that the induced sub-graph has only a small number of odd degree check nodes."

Trapping sets are related to the topology of the LDPC graph and to the specific decoding algorithm used, are hard to avoid and are hard to analyze.

Trapping sets are a problem in the field of storage since historically the reliability required from storage devices is relatively high, for example 1 bit error per $10^{14}$ stored bits. The result is that codes employed in memory device such as flash memory devices should exhibit low error floor, but trapping sets increase the error floor.

The influence of trapping sets on the onset of error-floors in LDPC codes can be attributed to the following phenomena, related both to the properties of the code graph and decoding algorithm as well as to realization of certain special channel noise configurations. In the initial stage of BP decoding, due to the presence of special low-probability noise samples, variable nodes internal to one particular trapping set (termed the initial trapping set) experience a large increase in reliability estimates for incorrect bit values. This information gets propagated to other variable nodes in the trapping set, some of which already have unreliable bit estimates themselves.

After this initial biasing, external variables usually start to correct their initially incorrect estimates. By that time, however, the variable nodes in a trapping set have already been biased significantly in their decisions towards the wrong values. Since there are very few check nodes capable of detecting errors within trapping sets, this erroneous information persists in the graph until the end of the decoding process.

Furthermore, the unreliable estimates in trapping sets sometimes get "amplified" and/or "exported" to the variable nodes external to the trapping set. The degree of influence of the trapping set on the external variables (and vice versa) is an important factor that influences the behavior of trapping sets under iterative decoding, and that cannot be described in a simple manner.

One embodiment provided herein is a method of decoding a representation of a target codeword that encodes K information bits as N>K codeword bits, the method including: (a) importing the representation of the codeword from a channel; (b) in a plurality of decoding iterations, updating estimates of the codeword bits by steps including, in a graph that includes N bit nodes and N−K check nodes, exchanging decoding messages between the bit nodes and the check nodes; and (c) in each of at least one of the decoding iterations, modifying at least a portion of decoding values selected from the group consisting of respective decoding bit node values associated with the bit nodes, respective decoding check node values associated with the check nodes, and the decoding messages, wherein the modifying depends explicitly on an ordinality of the each decoding iteration, and wherein the modifying is independent of decoding iterations other than the each decoding iteration.

Another embodiment provided herein is a method of decoding a representation of a target codeword that encodes K information bits as N>K codeword bits, the method including: (a) importing the representation of the codeword from a channel; (b) in a plurality of decoding iterations, updating estimates of the codeword bits by steps including, in a graph that includes N bit nodes and N−K check nodes, exchanging decoding messages between the bit nodes and the check nodes; and (c) in each of at least one of the decoding iterations, modifying at least a portion of decoding values, selected from the group consisting of respective decoding bit node values associated with the bit nodes, respective decoding check node values associated with the check nodes, and the decoding messages, in accordance with respective locally heteromorphic rules.

Another embodiment provided herein is a decoder for decoding a representation of a codeword that encodes K information bits as N>K codeword bits, including a processor for decoding the representation of the codeword by executing an algorithm for updating estimates of the codeword by steps including: (a) in a plurality of decoding iterations, updating estimates of the codeword bits by steps including, in a graph that includes N bit nodes and N−K check nodes, exchanging decoding messages between the bit nodes and the check nodes; and (b) in each of at least one of the decoding iterations, modifying at least a portion of decoding values selected from the group consisting of respective decoding bit node values associated with the bit nodes, respective decoding check node values associated with the check nodes, and the decoding messages, wherein the modifying depends explicitly on an ordinality of the each decoding iteration, and wherein the modifying is independent of decoding iterations other than the each decoding iteration.

Another embodiment provided herein is a decoder for decoding a representation of a codeword that encodes K information bits as N>K codeword bits, including a processor for decoding the representation of the codeword by executing an algorithm for updating estimates of the codeword by steps including: (a) in a plurality of decoding iterations, updating estimates of the codeword bits by steps including, in a graph that includes N bit nodes and N−K check nodes, exchanging decoding messages between the bit nodes and the check nodes; and (b) in each of at least one of the decoding iterations, modifying at least a portion of decoding values, selected from the group consisting of respective decoding bit node values associated with the bit nodes, respective decoding check node values associated with the check nodes, and the decoding messages, in accordance with respective locally heteromorphic rules.

Another embodiment provided herein is a memory controller including: (a) an encoder for encoding K information bits as a codeword of N>K codeword bits; and (b) a decoder including a processor for decoding a representation of the codeword by executing an algorithm for updating estimates of the codeword by steps including: (i) in a plurality of decoding iterations, updating estimates of the codeword bits by steps including, in a graph that includes N bit nodes and N−K check nodes, exchanging decoding messages between the bit nodes and the check nodes, and (ii) in each of at least one of the decoding iterations, modifying at least a portion of decoding values selected from the group consisting of respective decoding bit node values associated with the bit nodes, respective decoding check node values associated with the check nodes, and the decoding messages, wherein the modifying depends explicitly on an ordinality of the each decoding iteration, and wherein the modifying is independent of decoding iterations other than the each decoding iteration.

Another embodiment provided herein is a memory controller including: (a) an encoder for encoding K information bits as a codeword of N>K codeword bits; and (b) a decoder including a processor for decoding a representation of the codeword by executing an algorithm for updating estimates of the codeword by steps including: (i) in a plurality of decoding iterations, updating estimates of the codeword bits by steps including, in a graph that includes N bit nodes and N−K check nodes, exchanging decoding messages between the bit nodes and the check nodes, and (ii) in each of at least one of the decoding iterations, modifying at least a portion of decoding values, selected from the group consisting of respective decoding bit node values associated with the bit nodes, respective decoding check node values associated with the check nodes, and the decoding messages, in accordance with respective locally heteromorphic rules.

Another embodiment provided herein is a receiver including: (a) a demodulator for demodulating a message received from a communication channel, thereby producing a representation of a codeword that encodes K information bits as N>K codeword bits; and (b) a decoder including a processor for decoding the representation of the codeword by executing an algorithm for updating estimates of the codeword by steps including; (i) in a plurality of decoding iterations, updating estimates of the codeword bits by steps including, in a graph that includes N bit nodes and N−K check nodes, exchanging decoding messages between the bit nodes and the check nodes, and (ii) in each of at least one of the decoding iterations, modifying at least a portion of decoding values selected from the group consisting of respective decoding bit node values associated with the bit nodes, respective decoding check node values associated with the check nodes, and the decoding messages, wherein the modifying depends explicitly on an ordinality of the each decoding iteration, and wherein the modifying is independent of decoding iterations other than the each decoding iteration.

Another embodiment provided herein is a receiver including: (a) a demodulator for demodulating a message received from a communication channel, thereby producing a representation of a codeword that encodes K information bits as N>K codeword bits; and (b) a decoder including a processor for decoding the representation of the codeword by executing an algorithm for updating estimates of the codeword by steps including: (i) in a plurality of decoding iterations, updating estimates of the codeword bits by steps including, in a graph that includes N bit nodes and N−K check nodes, exchanging decoding messages between the bit nodes and the check nodes, and (ii) in each of at least one of the decoding iterations, modifying at least a portion of decoding values, selected from the group consisting of respective decoding bit node values associated with the bit nodes, respective decoding check node values associated with the check nodes, and the decoding messages, in accordance with respective locally heteromorphic rules.

Another embodiment provided herein is a communication system for transmitting and receiving a message, including: (a) a transmitter including: (i) an encoder for encoding K information bits of the message as a codeword of N>K codeword bits, and (ii) a modulator for transmitting the codeword via a communication channel as a modulated signal; and (b) a receiver including: (i) a demodulator for receiving the modulated signal from the communication channel and for demodulating the modulated signal, thereby providing a representation of the codeword, and (ii) a decoder including a processor for decoding the representation of the codeword by executing an algorithm for updating estimates of the codeword by steps including: (A) in a plurality of decoding iterations, updating estimates of the codeword bits by steps including, in a graph that includes N bit nodes and N−K check nodes, exchanging decoding messages between the bit nodes and the check nodes, and (B) in each of at least one of the decoding iterations, modifying at least a portion of decoding values selected from the group consisting of respective decoding bit node values associated with the bit nodes, respective decoding check node values associated with the check nodes, and the decoding messages, wherein the modifying depends explicitly on an ordinality of the each decoding iteration, and wherein the modifying is independent of decoding iterations other than the each decoding iteration.

Another embodiment provided herein is a communication system for transmitting and receiving a message, including: (a) a transmitter including: (i) an encoder for encoding K information bits of the message as a codeword of N>K codeword bits, and (ii) a modulator for transmitting the codeword via a communication channel as a modulated signal; and (b) a receiver including: (i) a demodulator for receiving the modulated signal from the communication channel and for demodulating the modulated signal, thereby providing a representation of the codeword, and (ii) a decoder including a processor for decoding the representation of the codeword by executing an algorithm for updating estimates of the codeword by steps including: (A) in a plurality of decoding iterations, updating estimates of the codeword bits by steps including, in a graph that includes N bit nodes and N−K check nodes, exchanging decoding messages between the bit nodes and the check nodes, and (B) in each of at least one of the decoding iterations, modifying at least a portion of decoding values, selected from the group consisting of respective decoding bit node values associated with the bit nodes, respective decoding check node values associated with the check nodes, and the decoding messages, in accordance with respective locally heteromorphic rules.

Another embodiment provided herein is a method of decoding a representation of a codeword that encodes K information bits as N>K codeword bits, the method including: (a) importing the representation of the codeword from a channel; (b) providing a parity check matrix having N−K rows and N columns; (c) in a plurality of decoding iterations, updating estimates of the codeword bits by steps including exchanging messages between the rows and the columns of the matrix; and (d) in each of at least one of the decoding iterations, modifying at least a portion of values selected from the group consisting of respective row values associated with the rows of the matrix, respective column values associated with the columns of the matrix, and the messages, wherein the modifying depends explicitly on an ordinality of the each decoding iteration, and wherein the modifying is independent of decoding iterations other than the each decoding iteration.

Another embodiment provided herein is a method of decoding a representation to of a codeword that encodes K information bits as N>K codeword bits, the method including: (a) importing the representation of the codeword from a channel; (b) providing a parity check matrix having N−K rows and N columns; (c) in a plurality of decoding iterations, updating estimates of the codeword bits by steps including exchanging messages between the rows and the columns; and (d) in each of at least one of the decoding iterations, modifying at least a portion of values, selected from the group consisting of respective row values associated with the rows of the matrix, respective column values associated with the columns of the matrix, and the messages, in accordance with respective locally heteromorphic rules.

Another embodiment provided herein is a decoder for decoding a representation of a codeword that encodes K information bits as N>K codeword bits, including a processor for decoding the representation of the codeword by executing an algorithm for updating estimates of the codeword by steps including: (a) providing a parity check matrix having N−K rows and N columns; (b) in a plurality of decoding iterations, updating estimates of the codeword bits by steps including exchanging messages between the tows and the columns; and (c) in each of at least one of the decoding iterations, modifying at least a portion of values selected from the group consisting of respective row values associated with the rows of the matrix, respective column values associated with the columns of the matrix, and the messages, wherein the modifying depends explicitly on an ordinality of the each decoding iteration, and wherein the modifying is independent of decoding iterations other than the each decoding iteration.

Another embodiment provided herein is a decoder for decoding a representation of a codeword that encodes K information bits as N>K codeword bits, including a processor for decoding the representation of the codeword by executing an algorithm for updating estimates of the codeword by steps including: (a) providing a parity check matrix having N−K rows and N columns; (b) in a plurality of decoding iterations, updating estimates of the codeword bits by steps including exchanging messages between the rows and the columns; and (c) in each of at least one of the decoding iterations, modifying at least a portion of values, selected from the group consisting of respective row values associated with the rows of the matrix, respective column values associated with the columns of the matrix, and the messages, in accordance with respective locally heteromorphic rules.

Another embodiment provided herein is a memory controller including: (a) an encoder for encoding K information bits as a codeword of N>K codeword bits; and (b) 2o a decoder including a processor for decoding a representation of the codeword by executing an algorithm for updating estimates of the codeword by steps including: (i) providing a parity check matrix having N−K rows and N columns; (ii) in a plurality of decoding iterations, updating estimates of the codeword bits by steps including exchanging messages between the rows and the columns, and (iii) in each of at least one of the decoding iterations, modifying at least a portion of values selected from the group consisting of respective row values associated with the rows of the matrix, respective column values associated with the columns of the matrix, and the messages, wherein the modifying depends explicitly on an ordinality of the each decoding iteration, and wherein the modifying is independent of decoding iterations other than the each decoding iteration.

Another embodiment provided herein is a memory controller including: (a) an encoder for encoding K information bits as a codeword of N>K codeword bits; and (b) a decoder including a processor for decoding a representation of the codeword by executing an algorithm for updating estimates of the codeword by steps including: (i) providing a parity check matrix having N−K rows and N columns; (ii) in a plurality of decoding iterations, updating estimates of the codeword bits by steps including exchanging messages between the rows and the columns; and (iii) in each of at least one of the decoding iterations, modifying at least a portion of values, selected from the group consisting of respective row values associated with the rows of the matrix, respective column values associated with the columns of the matrix, and the messages, in accordance with respective locally heteromorphic rules.

Another embodiment provided herein is a receiver including: (a) a demodulator for demodulating a message received from a communication channel, thereby producing a representation of a codeword that encodes K information bits as N>K codeword bits; and (b) a decoder including a processor for decoding the representation of the codeword by executing an algorithm for updating estimates of the codeword by steps including: (i) providing a parity check matrix having N−K rows and N columns; (ii) in a plurality of decoding iterations, updating estimates of the codeword bits by steps including exchanging messages between the rows and the columns, and (iii) in each of at least one of the decoding iterations, modifying at least a portion of values selected from the group consisting of respective row values associated with the rows of the matrix, respective column values associated with the columns of the matrix, and the messages, wherein the modifying depends explicitly on an ordinality of the each decoding iteration, and wherein the modifying is independent of decoding iterations other than the each decoding iteration.

Another embodiment provided herein is a receiver including: (a) a demodulator for demodulating a message received from a communication channel, thereby producing a representation of a codeword that encodes K information bits as N>K codeword bits; and (b) a decoder including a processor for decoding the representation of the codeword by executing an algorithm for updating estimates of the codeword by steps including: (i) providing a parity check matrix having N−K rows and N columns; (ii) in a plurality of decoding iterations, updating estimates of the codeword bits by steps including exchanging messages between the rows and the columns; and (iii) in each of at least one of the decoding iterations, modifying at least a portion of values, selected from the group consisting of respective row values associated with the rows of the matrix, respective column values associated with the columns of the matrix, and the messages, in accordance with respective locally heteromorphic rules.

Another embodiment provided herein is a communication system for transmitting and receiving a message, including: (a) a transmitter including: (i) an encoder for encoding K information bits of the message as a codeword of N>K codeword bits, and (ii) a modulator for transmitting the codeword via a communication channel as a modulated signal; and (b) a receiver including: (i) a demodulator for receiving the modulated signal from the communication channel and for demodulating the modulated signal, thereby providing a representation of the codeword, and (ii) a decoder including a processor for decoding the representation of the codeword by executing an algorithm for updating estimates of the codeword by steps including: (A) providing a parity check matrix having N−K rows and N columns; (B) in a plurality of decoding iterations, updating estimates of the codeword bits by steps including exchanging messages between the rows and the columns, and (C) in each of at least one of the decoding iterations, modifying at least a portion of values selected from the group consisting of respective row values associated with the rows of the matrix, respective column values associated with the columns of the matrix, and the messages, wherein the modifying depends explicitly on an ordinality of the each decoding iteration, and wherein the modifying is independent of decoding iterations other than the each decoding iteration.

Another embodiment provided herein is a communication system for transmitting and receiving a message, including: (a) a transmitter including: (i) an encoder for encoding K information bits of the message as a codeword of N>K codeword bits, and (ii) a modulator for transmitting the codeword via a communication channel as a modulated signal; and (b) a receiver including: (i) a demodulator for receiving the modulated signal from the communication channel and for demodulating the modulated signal, thereby providing a representation of the codeword, and (ii) a decoder including a processor for decoding the representation of the codeword by executing an algorithm for updating estimates of the codeword by steps including: (A) providing a parity check matrix having N−K rows and N columns; (B) in a plurality of decoding iterations, updating estimates of the codeword bits by steps including exchanging messages between the rows and the columns; and (C) in each of at least one of the decoding iterations, modifying at least a portion of values, selected from the group consisting of respective row values associated with the rows of the matrix, respective column values associated with the columns of the matrix, and the messages, in accordance with respective locally heteromorphic rules.

Four general methods are provided herein for decoding a representation, that has been imported from a channel, of a codeword that encodes K information bits as N>K codeword bits.

According to the first two general methods, in a plurality of decoding iterations, estimates of the codeword bits are updated by exchanging decoding messages between the bit nodes and the check nodes of a graph that includes N bit nodes and N−K check nodes. In each of one or more of the decoding iterations, some or all of decoding values" are modified. The decoding values that are modified could be respective decoding bit node values associated with the bit nodes, and/or respective decoding check node values associated with the check nodes, and/or the decoding messages. These values are called "decoding" values in the appended claims to distinguish them from "calibration" values that may be used to calibrate rules by which the decoding values may be modified. Similarly, the iterations are called "decoding" iterations in the appended claims to distinguish them from "calibration" iterations that may be used to calibrate the rules by which the decoding values are modified.

According to the first general method, the modifying depends explicitly on the ordinality (first vs. second vs. third etc.) of the decoding iteration and is independent of the other decoding iterations. That the modifying is independent of the other decoding iterations is a feature of the method that distinguishes the method from the conventional "damping by averaging" that is described below.

According to the second general method, the modifying of a decoding value is in accordance with a respective, locally heteromorphic rule. Optionally, in the second method, the modifying is independent of the other decoding iterations.

Decoding bit node values and decoding check node values are modified before they are used in the computation of new decoding messages. Decoding messages are modified either at the nodes where they are computed, before they are dispatched, or at the nodes where they are received, upon their receipt.

Preferably, according to the first two methods, the decoding values that are modified are some or all of the decoding messages.

Preferably, according to the first two methods, within an iteration in which decoding values are modified, the modification is effected before testing whether the updating of the estimates of the codeword bits has converged. (A typical criterion for convergence is that the column vector of estimated codeword bits satisfies equation (3).)

Preferably, according to the first two methods, if a decoding message is modified, the modifying depends on the bit node and the check node that exchange the decoding message. For example, the damping factors $\alpha_e^I$ of the preferred embodiment described below depend on bit nodes and on check nodes via their edge indices "e".

Preferably, according to the first two methods, the modifying of a decoding value includes multiplying the decoding value by a damping factor that is greater than zero and less than one.

Preferably, according to the first two methods, the modifying of a decoding value includes multiplying by a factor that is a unction of the ordinality of the iteration in which the modifying is effected.

Preferably, according to the first method, each decoding value that is modified is modified according to a respective rule. Preferably both of the first two methods include the step of calibrating the rules.

More preferably, the rules are calibrated by exporting a plurality of instances of a calibration codeword to the channel and importing respective representations of the instances of the calibration codeword from the channel. Alternatively, the rules are calibrated by simulating the exporting of a plurality of instances of a calibration codeword to the channel and the importing from the channel of respective representations of the calibration codeword. For each such representation, in a plurality of calibration iterations, calibration messages are exchanged between the bit nodes and the check nodes. For each decoding value that is modified in a given decoding iteration, statistics of a corresponding calibration value (either a calibration bit node value of the same bit node in the calibration iteration of the same ordinality as the given decoding iteration, or a calibration check node value of the same check node in the calibration iteration of the same ordinality as the given decoding iteration, or a bit-node-to-check-node calibration message from the same bit node to the same check node in the calibration iteration of the same ordinality as the given decoding iteration, or a check-node-to-bit-node message from the same check node to the same bit node in the calibration iteration of the same ordinality as the given decoding iteration) are accumulated. The rule according to which a decoding value is modified in a given decoding iteration then is based on the statistics of the corresponding calibration value. Most preferably, the calibration codeword is a codeword of N identical bits. Also most preferably, for each decoding value that is modified, the statistics of the corresponding calibration value include an estimated error rate of the corresponding calibration value, and/or a mean s of the corresponding calibration value and a standard deviation a of the corresponding calibration value, in which case the respective rule includes multiplication by $2\mu/\sigma^2$. In the preferred embodiment described below, the messages are LLR messages L, the calibration codeword is a codeword of N zeros, and the estimated error rate is $P_r(L<0)$.

As noted above, the graphical representation of LDPC decoding is equivalent to a matrix representation, as illustrated in FIG. 1. Therefore, according to the third and fourth general methods, estimates of the codeword bits are updated using a parity check matrix to connect a bit vector having N bit vector elements and a check vector having N−K check vector elements. In a plurality of decoding iterations, estimates of the codeword bits are updated by exchanging messages between the bit vector elements and the check vector elements that are so connected. As in the first two general methods, in each of one or more of the decoding iterations, some or all of the (decoding) values are modified. The values that are modified could be respective row values associated with the rows of the matrix, and/or respective column values associated with the columns of the matrix, and/or the messages. According to the third general method, the modifying depends explicitly on the ordinality of the decoding iteration and is independent of the other decoding iterations. According to the fourth general method, the modifying of a decoding value is in accordance with a respective, locally heteromorphic rule.

A decoder corresponding to one of the four general methods includes one or more processors for decoding the representation of the codeword by executing an algorithm for updating the codeword bit estimates according to the corresponding general method.

A memory controller corresponding to one of the four general methods includes an encoder for encoding K information bits as a codeword of N>K bits and a decoder that corresponds to the general method. Normally, such a memory controller includes circuitry for storing at least a portion of the codeword in a main memory and for retrieving a (possibly noisy) representation of the at least portion of the codeword from the main memory. A memory device corresponding to one of the four general methods includes such a memory controller and also includes the main memory.

A receiver corresponding to one of the four general methods includes a demodulator for demodulating a message received from a communication channel. The demodulator provides a representation of a codeword that encodes K information bits as N>K codeword bits. Such a receiver also includes a decoder that corresponds to the general method.

A communication system corresponding to one of the four general methods includes a transmitter and a receiver. The transmitter includes an encoder for encoding K information bits of a message as a codeword of N>K codeword bits and a modulator for transmitting the codeword via a communication channel as a modulated signal. The receiver is a receiver that corresponds to the general method.

BRIEF DESCRIPTION OF THE DRAWINGS

Various embodiments are herein described, by way of example only, with reference to the accompanying drawings, wherein:

FIG. 2 shows a flooding schedule belief propagation algorithm;

FIG. 3 shows a conventional serial schedule belief propagation algorithm;

FIG. 6 shows a belief propagation algorithm in which messages are exchanged within sub-graphs and between the sub-graphs and a set of external check nodes;

DESCRIPTION OF THE PREFERRED EMBODIMENTS

Figure 1:
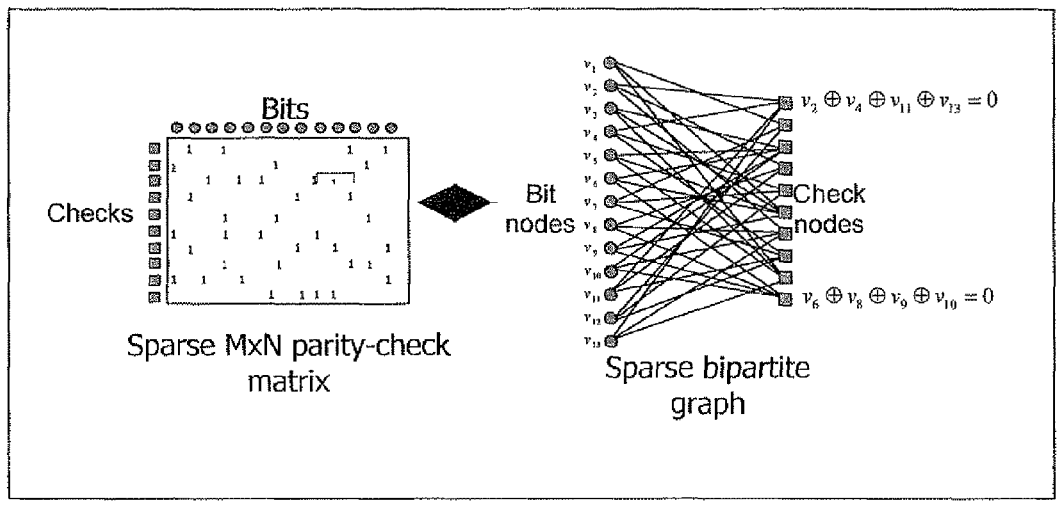
FIG. 1 shows how a LDPC code can be represented as either a sparse parity check matrix or a sparse bipartite graph.
Figure 4:
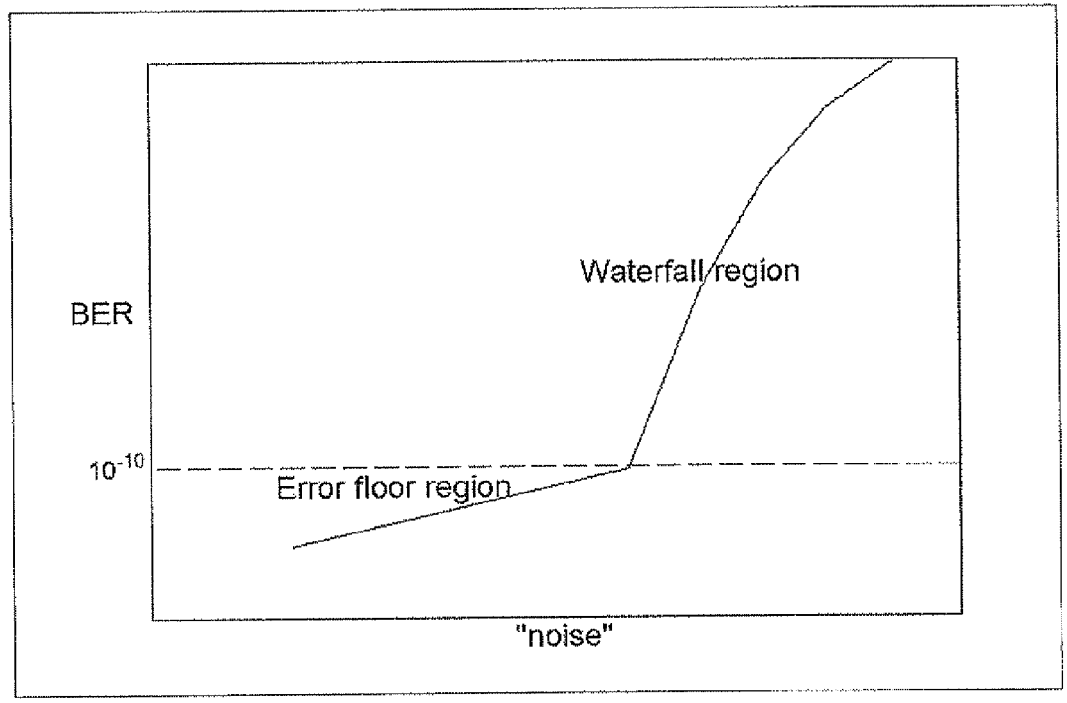
FIG. 4 illustrates error floor.

The principles and operation of low-complexity LPDC decoding may be better understood with reference to the drawings and the accompanying description.

In conventional decoders for LDPC codes, the memory required by the decoder is proportional to the code length N (equal to the number of variable nodes in the code's underlying graph $|V|$) and to the number of edges in the code's underlying graph $|E|$. In efficient implementations (e.g. based on serially scheduled decoders), the required memory can be as small as $(|V|+|E|)*bpm$ bits, where $|V|$ is the number of bit estimations, $|E|$ is the number of edge messages and bpm is the number of bits per message stored in the memory of the decoder (note that we assume here that the same number of bits is required for storing bit estimation and edge message, for the sake of simplicity, though this is not necessarily the case). The decoder presented herein uses much smaller memory for implementing the decoding, storing only a small fraction of the $|V|$ bit estimations and of the $|E|$ edge messages simultaneously, without any degradation in decoder's error correction capability, compared to a conventional decoder, assuming sufficient decoding time is available. This is achieved by employing an appropriate decoding schedule and using the decoding hardware described herein.

The methods and decoders described herein operate by dividing the underlying graph representing the code into several sections and to implement the message passing decoding algorithm by sequentially processing the different sections of the graph, one or more sections at a time. At each stage during decoding only the bit estimations and edge messages corresponding to the graph section(s) that is/are currently being processed are stored. This way a very long LDPC code can be employed, providing near optimal error correction capability and very low error floor, while utilizing a low complexity decoding hardware.

The decoders presented herein are highly suitable for usage in memory devices, principally for the three following reasons:

1. A low ECC error floor is especially important in memory devices, which have severe decoder output BER requirements ($<10^{-15}$). When short codes are used, achieving such low error floor is very hard and usually requires sacrificing the error correction capability of the code, which is already compromised due to the short length of the code. Therefore using an equivalent long code the error correction capability of the code is improved, and thus lower ECC redundancy is required for protecting information against a given memory "noise" which corrupts the stored data. This in turn results in better cost efficiency of the memory, because a larger amount of information can be stored in a given number of memory cells (or using a given memory silicon size). Hence, employing a long ECC in memory devices is expected to provide a significant advantage.

2. The LDPC methods presented herein allow for processing a section of the code's underlying graph at each processing phase, instead of the entire graph at once. This means that we can store only a part of the "soft" bit estimations at each phase and not all of the "soft" bit estimations at once. Here the term "soft" bit estimates refers to a collection of bits describing the reliability of an estimate 'y' for each stored bit deduced from reading from the storage possibly flash device).

This feature can be easily utilized in a memory device, because only the presently required bit observations (y) can be read from the storage device, hence there is no need for a large buffer in the memory controller in order to implement the ECC decoding. Alternatively, even if all bit observations (represented by the vector $\underline{y}$) are read from the memory at once, the buffer required for storing them is usually much smaller than the memory required for storing the bit observations (the $P_v$ messages) required by the decoder. This way, only part of the soft bit estimates corresponding to the graph section that is currently being processed by the decoder are generated each time, resulting in a smaller decoder memory requirement.

Consider for example a SLC Flash memory device (a Flash memory device that stores one bit per cell; "SLC" means "Single Level Cell" and actually is a misnomer because each cell supports two levels; the "S" in "SLC" refers to there being only one programmed level.), in which each cell stores a single bit v and the state y read from each cell can be either 0 or 1. Then the memory needed for storing the vector y of read cell states is N bits. On the other hand, the memory required for storing all the soft bit estimates ($P_v$ messages) can be larger (for example 6N bits if each LLR estimate is stored in 6 bits). Hence, it is more efficient to generate only the required soft bit estimates in each decoder activation. A LLR bit estimate $$P_v = \log \frac{Pr(v=0|y)}{Pr(v=1|y)}$$

for some bit v can be generated from the corresponding bit observations $\underline{y}$ that are read from the flash memory device based on an a-priori knowledge of the memory "noise". In other words, by knowing the memory "noise" statistics we can deduce the probability that a bit v that was stored in a certain memory cell is 0/1 given that 'y' is read from the cell.

For example, assume that in a certain SLC Flash memory device the probability of reading the state of the cell different than the one it was programmed to is $p-10^{-2}$, then if y=0 then $$P_v = \log\frac{1-p}{p} = 4.6$$

and if y=1 then $$P_v = \log\frac{p}{1-p} = -4.6.$$

Furthermore, if the number of states that can be read from each cell of the flash device (represented by 'y') is 8 because the cell stores a single bit (one "hard bit") and the device is configured to read eight threshold voltage levels, equivalent to two 'soft bits", then each element 'y' which requires, in the controller, storage for 3 bits, is converted to an LLR value $P_v$ that may be represented as more than 3 bits, for example as 6 bits (BPM=Bits Per Message=6). These 6 bits are a soft bit estimate as opposed to the 2 soft bits read from the flash cell and corresponding to this 6-bit LLR value.

3. A decoding schedule of the type presented herein allow for a smaller memory requirement (compared with conventional decoding schedules). However, the decoding schedules presented herein might slow down the decoder convergence rate and increase the decoding time, especially when operating near the decoder's maximal error correction capability. Such a decoder is highly suitable for memory devices, which can tolerate variable ECC decoding latencies. For example, if the required decoding time for the ECC to converge to the correct stored codeword is long due to a high number of corrupted bits, then the memory controller can stop reading the memory until the decoding of the previously read codeword is finalized. Note that during most of a flash memory device's life, the memory "noise" is small and the number of corrupted bits is small. Hence, the decoder operates efficiently and quickly, allowing for an efficient pipelined memory reading. Rarely, the number of corrupted bits read from the memory is high, requiring longer decoding time and resulting in a reading pipeline stall. Therefore on average the throughput is left unharmed even with these variable decoding time characteristics.

According to one class of embodiments, the bipartite graph G=(V,C,E) that represents the code is divided into several sections in the following way. 1) Divide the set V of bit nodes into t disjoint subsets: $V_1, V_2, \ldots, V_t$ (such that $V = V_1 \cup V_2 \cup \ldots \cup V_t$). 2) For each subset $V_i$ of bit nodes, form a subset $C_i$ of check nodes, including all of the check nodes that are connected solely to the bit nodes in $V_i$. 3) Form a subset $C_J$ of external check nodes, including all of the check nodes that are not in any of the check node subsets formed so far, i.e. $C_J = C \setminus (C_1 \cup C_2 \cup \ldots \cup C_t)$. 4) Divide the graph G into t sub-graphs $G_1, G_2, \ldots, G_t$ such that $G_i = (V_i, C_i, E_i)$ where $E_i$ is the set of edges connected between bit nodes in $V_i$ and check nodes in $C_i$. Denote the edges connected to the set $C_J$ by $E_J$ (note that $E_J = E \setminus (E_1 \cup E_2 \cup \ldots \cup E_t)$).

Figure 5:
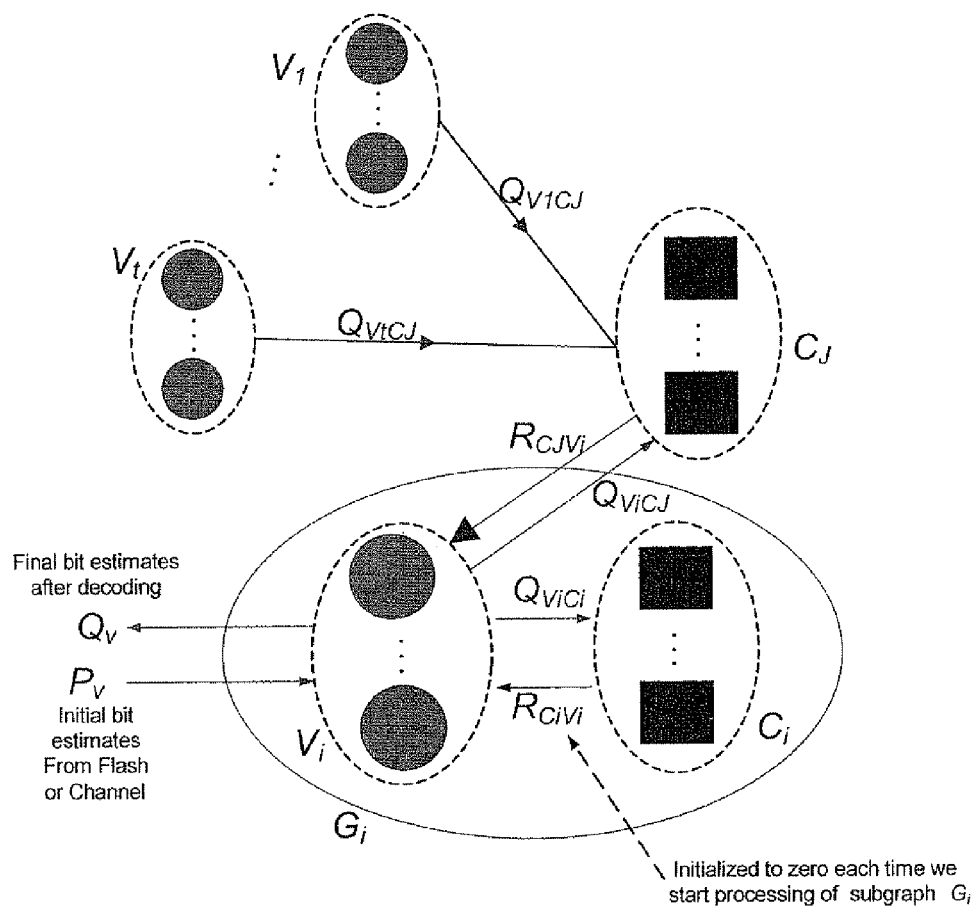
FIG. 5 shows how messages are exchanged within a sub-graph and between a sub-graph and a set of external check nodes.

In these embodiments, the graph G is processed according to a special message passing schedule, by iteratively performing decoding phases, and in each decoding phase exchanging messages along the graph edges in the following order:

for i=1 through t
1. Send $R_{cv}$ messages from check nodes $c \in C_J$ to bit nodes $v \in V_i$ along edges in $E_J$, depicted as the $R_{c_J v_i}$ messages in FIG. 5. Set $R_{cv}$ messages from check nodes $c \in C_i$ to bits nodes $v \in V_i$ to zero, depicted by the $Rc_i v_i$ messages in FIG. 5. Set initial bit estimations to $P_v$ for every bit $v \in V_i$, depicted as the $P_{V_i}$ messages in FIG. 5. Note that the messages $R_{c_J v_i}$ are the result of activating the decoder for the other t−1 sub-graphs $G_k$, k≠i, prior to this step. In the event that other sub-graphs have not been processed yet, their corresponding messages $Q_{v_i c_J}$ in FIG. 5 are set to $P_{v_i}$, i.e., the estimates read from the memory or received from the communication channel. In case those are punctured bits, their $P_{v_i}$'s are zero.

2. Perform one or more iterations by sending $Q_{vc}$ messages from bit nodes in $V_i$ to check nodes in $C_i$, and $R_{cv}$ messages from check nodes in $C_i$ to bit nodes in $V_i$, along the edges in $E_i$, according to some schedule (e.g. according to the serial schedule described in FIG. 3, performed by serially traversing the check nodes in $C_i$ and for each check node sending the messages to and from that check node). This is depicted as the $Qv_i c_i$ and $Rc_i v_i$ messages in FIG. 5.

3. Send $Q_{vc}$ messages from bit nodes in $V_i$ to check nodes in $C_J$ along the edges in $E_J$, depicted as the $Qv_i c_J$ messages in FIG. 5.

Decoding continues until the decoder converges to a valid codeword, satisfying all the parity-check constraints, or until a maximum number of allowed decoding phases is reached. The stopping criterion for the message passing within each sub-graph i is similar: iterate until either all the parity-check constraints within this sub-graph are satisfied or a maximum number of allowed iterations is reached. In general, the maximum allowed number of iterations may change from one sub-graph to another or from one activation of the decoder to another.

The messages sent along the edges in $E_J$ ($R_{c_J v_i}$ messages and $Qv_i c_J$ messages in FIG. 5) are used for exchanging information between the different sections of the graph. The messages that are sent at each stage during decoding can be computed according to the standard computation rules of the message passing decoding algorithm. For example, if BP decoding is implemented then the messages are computed according to equations (4) and (5). Other message-passing decoding algorithms, such as Min Sum algorithms, Gallagher A algorithms and Gallagher B algorithms, have their own computation rules.

Such a decoding algorithm, assuming serially scheduled message passing decoding within each sub-graph, implementing BP decoding, is summarized in FIG. 6. In this algorithm, at each stage during decoding only the $Q_v$ messages corresponding to bit nodes $v \in V_i$, the $R_{cv}$ messages corresponding to the edges in $E_i$ and the messages corresponding to the edges in $E_J$ are stored. Hence, the decoder of this class of embodiments requires storing only $(\max\{|V_1|, |V_2|, \ldots, |V_t|\} + \max\{|E_1|, |E_2|, \ldots, |E_t|\} + |E_J|)$ messages simultaneously, compared to (|V|+|E|) messages in efficient conventional decoders. Thus the memory requirement is ~1/t fraction of the memory required for a conventional decoder. When implementing long LDPC codes this provides a significant advantage in a decoder's complexity.

Figure 7A:
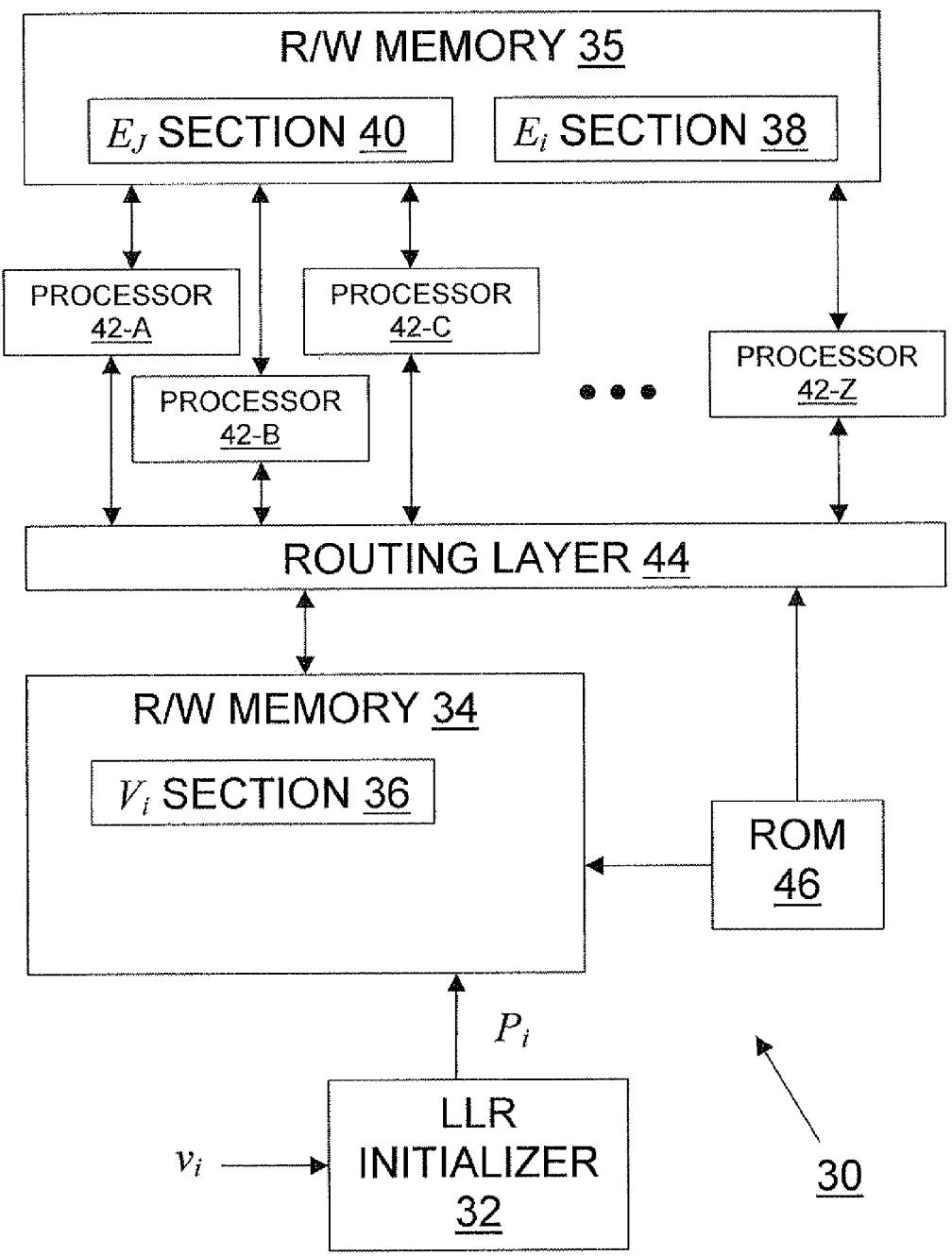
FIGS. 7A and 7B are high-level schematic block diagrams of decoders for implementing the algorithm of FIG. 6.

A high-level schematic block diagram of an exemplary decoder 30 according to this class of embodiments is shown in FIG. 7A. Decoder 30 includes:

1. An initial LLRs computation block 32 that computes the initial bit estimations $P_i = [P_v : v \in V_i]$ for bits $v \in V_i$ in the currently processed sub-graph $G_i = (V_i, C_i, E_i)$, based on the corresponding bit observations $y_i = [y_v : v \in V_i]$ read from the memory or received from the communication channel (where $y_v$ is the observation corresponding to bit v).

2. A read/write memory 34 including a memory section 36 for storing the bit estimations for bit nodes v∈$V_i$ in the currently processed sub-graph ($Q_v$ messages which are initialized as the $P_v$ messages).
3. A read/write memory 35 including:
   3a. A memory section 38 for storing the $R_{cv}$ messages corresponding to the edge set $E_i$ of the currently processed sub-graph.
   3b. A memory section 40 for storing the messages along the edges in $E_J$. Memory section 40 stores: i) the $Q_{vc}$ messages from bit nodes v∈$V_i$, ∀i'∈{1, . . . ,n}\i to check nodes c∈$C_J$, where i is the index of the currently processed sub-graph ii) for bit nodes v∈$V_i$ memory section 40 first stores the $R_{cv}$ messages from check nodes c∈$C_J$ and afterwards the sub-graph's processing memory section 40 stores the $Q_{vc}$ to check nodes c∈$C_J$.
4. Processing units 42 for implementing the computations involved in updating the messages (as shown in FIG. 6).
5. A routing layer 44 that routes messages between memory 34 and processing units 42. For example, in some subclasses of this class of embodiments, within the loop over sub-graphs $G_1$ through $G_t$ in FIG. 6, routing layer 44 assigns each processor 42 its own check node of the current sub-graph $G_i$ and the check node processing is done in parallel for all the check nodes of $G_i$ (or for as many check nodes of $G_i$ as there are processors 42).
6. A read-only memory (ROM) 46 for storing the code's graph structure. Memory addressing, and switching by routing layer 44, are based on entries in ROM 46.

Decoder 30 includes a plurality of processing units 42 so that the computations involved in updating the messages may be effected in parallel. An alternative embodiment with only one processing unit 42 would not include a routing layer 44.

Figure 7B:
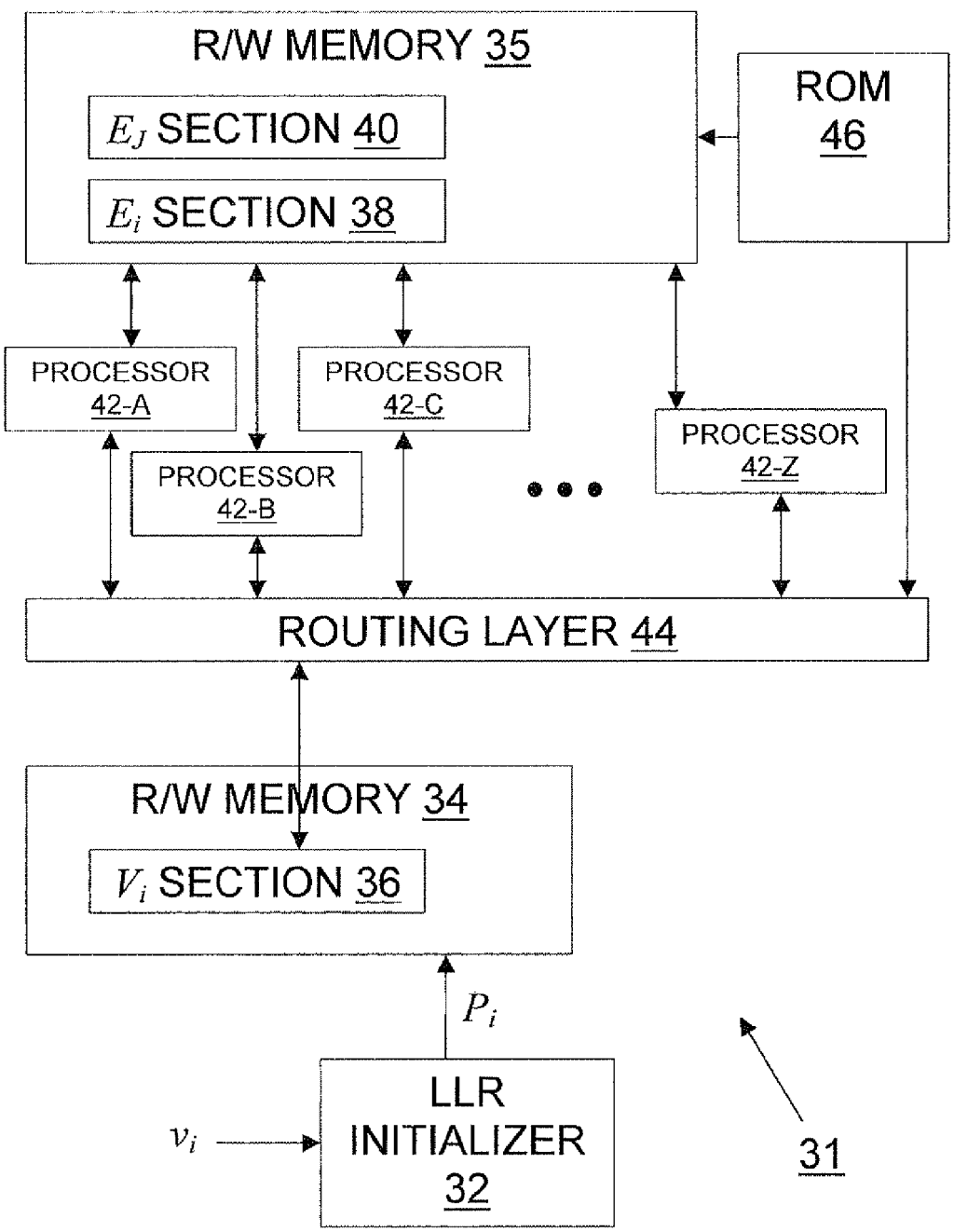

As noted above, a serial passing schedule traverses serially either the check nodes or the bit nodes. Decoder 30 of FIG. 7A traverses the check nodes serially. FIG. 7B is a high-level schematic block diagram of a similar decoder 31 that traverses the bit nodes serially.

Figure 8:
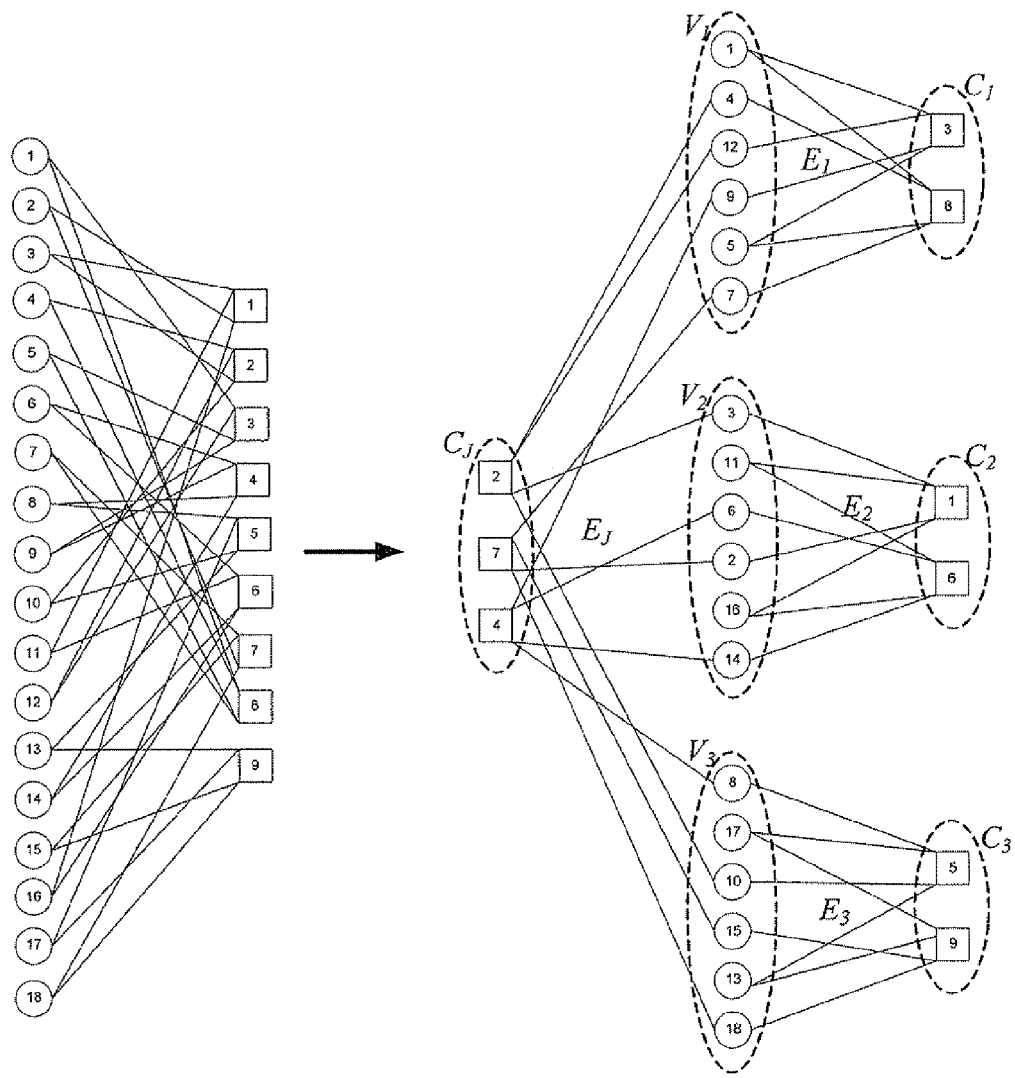
FIGS. 8 and 9 show two ways of partitioning the sparse bipartite graph of FIG. 1 into sub-graphs.

An example of the graph partitioning according to this class of embodiments is shown in FIG. 8. An LDPC code which is described by a regular bipartite graph with 18 bit nodes and 9 check nodes, such that every bit node is connected to two check nodes and every check node is connected to four bit nodes is used in this example. This is a length 18, rate ½ LDPC code. The original graph is shown on the left side of FIG. 8. This also is the graph of FIG. 1. The graph after partitioning its bit nodes, check nodes and edges into subsets is shown on the right side of FIG. 8. Note that this is the same graph, only rearranged for sake of clarity. For this code, a prior art efficient decoder would require storing 18+36=54 messages, while the corresponding decoder 30 requires storing only 6+8+12=26 messages, providing 52% reduction in the decoder's memory complexity, while maintaining the same error correction capability.

It is preferred that all the sub-graphs be topologically identical, as in the example of FIG. 8. In this context, "topological identity" means that all the sub-graphs have equal numbers of bit nodes and equal numbers of check nodes; that each bit node has a corresponding bit node in every other sub-graph in terms of connectivity to internal check nodes; and that each sub-graph check node has a corresponding check node in every other sub-graph in terms of connectivity to bit nodes. For example, in FIG. 8:
Bit nodes 1, 5, 11, 13, 16 and 17 correspond because hit nodes 1 and 5 are connected to both check nodes of sub-graph 1, bit nodes 11 and 16 are connected to both check nodes of sub-graph 2, bit nodes 13 and 17 are connected to both check nodes of sub-graph 3, and none of these bit nodes is connected to an external check node (a check node of set $C_J$).

The remaining bit nodes correspond because each of these bit nodes is connected to one check node of the same sub-graph.

All the check nodes of the sub-graphs correspond because each one of these check nodes is connected to the two bit nodes of its sub-graph that are connected only to sub-graph check nodes and to two other bits of its sub-graph that are also connected to external check nodes.

Note that the sub-graphs need not have identical connectivity to the external check nodes in order to be "topologically identical". For example, the two bit nodes, 15 and 18, of sub-graph 3, that are connected to the same external check node 7, are also connected to the same check node 9 of sub-graph 3, but the two bit nodes, 4 and 12, of sub-graph 1, that are connected to the same external check node 2, are connected to different check nodes (3 and 8) of sub-graph 1.

If need be, however, any LDPC graph G can be partitioned into sub-graphs by a greedy algorithm. The first sub-graph is constructed by selecting an arbitrary set of bit nodes. The check nodes of the first sub-graph are the check nodes that connect only to those bit nodes. The second sub-graph is constructed by selecting an arbitrary set of bit nodes from among the remaining bit nodes. Preferably, of course, the number of bit nodes in the second sub-graph is the same as the number of bit nodes in the first sub-graph. Again, the check nodes of the second sub-graph are the check nodes that connect only to the bit nods of the second sub-graph. This is arbitrary selection of bit nodes is repeated as many times as desired. The last sub-graph then consists of the bit nodes that were not selected and the check nodes that connect only to those bit nodes. The remaining check nodes constitute $C_J$.

Figure 9:
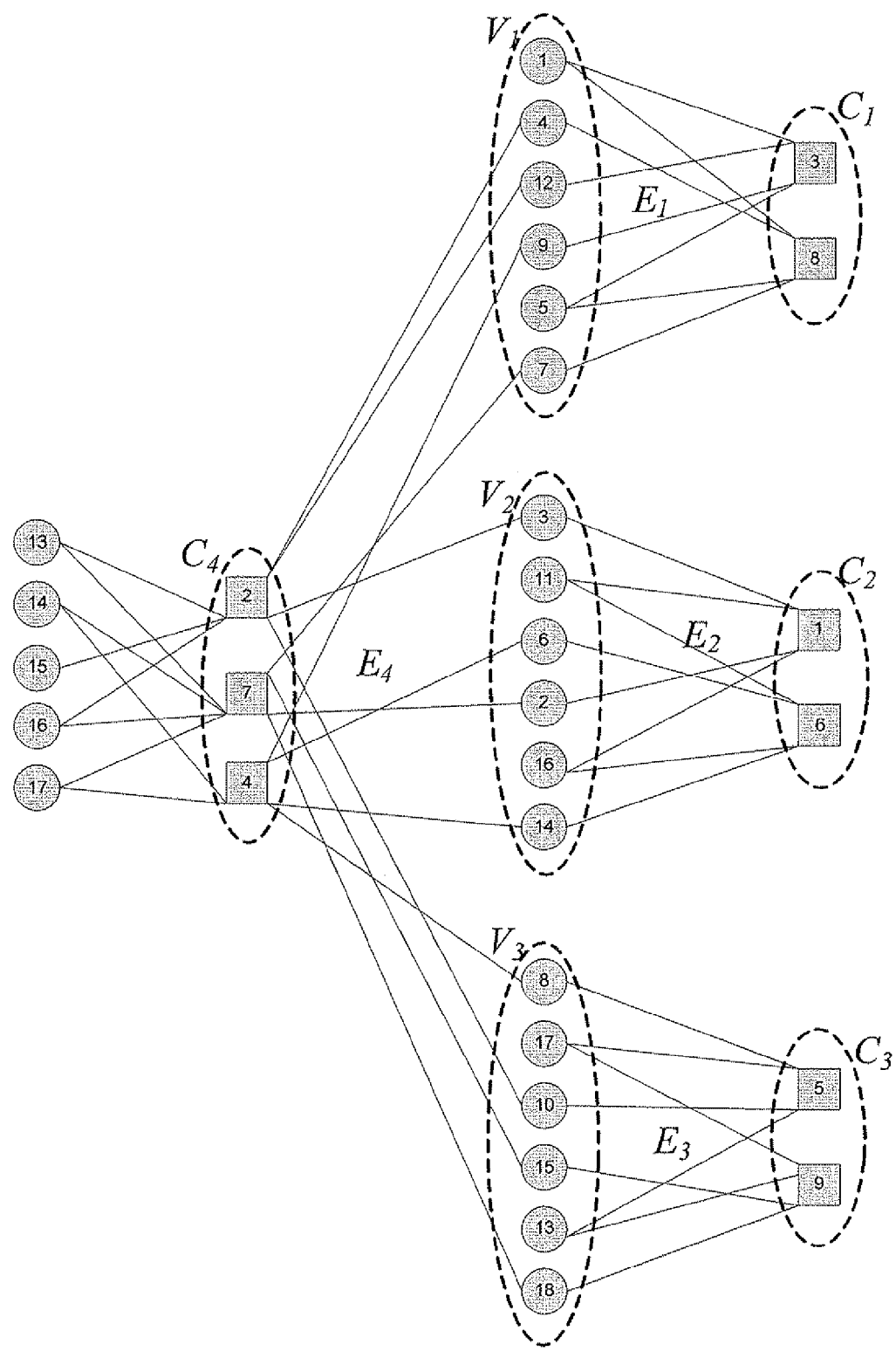

In the class of embodiments described above, the LDPC graph G is partitioned into t sub-graphs, each with its own bit nodes and check nodes, plus a separate subset $C_J$ of only check nodes. In another class of embodiments, as illustrated in FIG. 9, G is partitioned into just t sub-graphs, each with its own bit nodes and check nodes. For example, using the greedy algorithm described above, the last sub-graph ($G_t$) includes the non-selected bit nodes, the check nodes that connect only to these bit nodes, and also all the remaining check nodes. This is equivalent to the set $C_J$ of the first class of embodiments being connected to its own subset of bit nodes separate from the bit nodes of the sub-graphs. In this class of embodiments, the algorithm of FIG. 6 is modified by including only sub-graphs $G_1$ through $G_{t-1}$ in the sub-graphs loop and ending each decoding phase by following the sub-graphs loop with a separate exchange of messages exclusively within $G_t$. FIG. 9 shows the case of t=4. In one subclass of these embodiments, some of the bits are punctured bits, and $G_t$ is dedicated to these bits: all the bits of $G_t$ are punctured bits, and all the punctured bits are bits of $G_t$.

Figure 10:
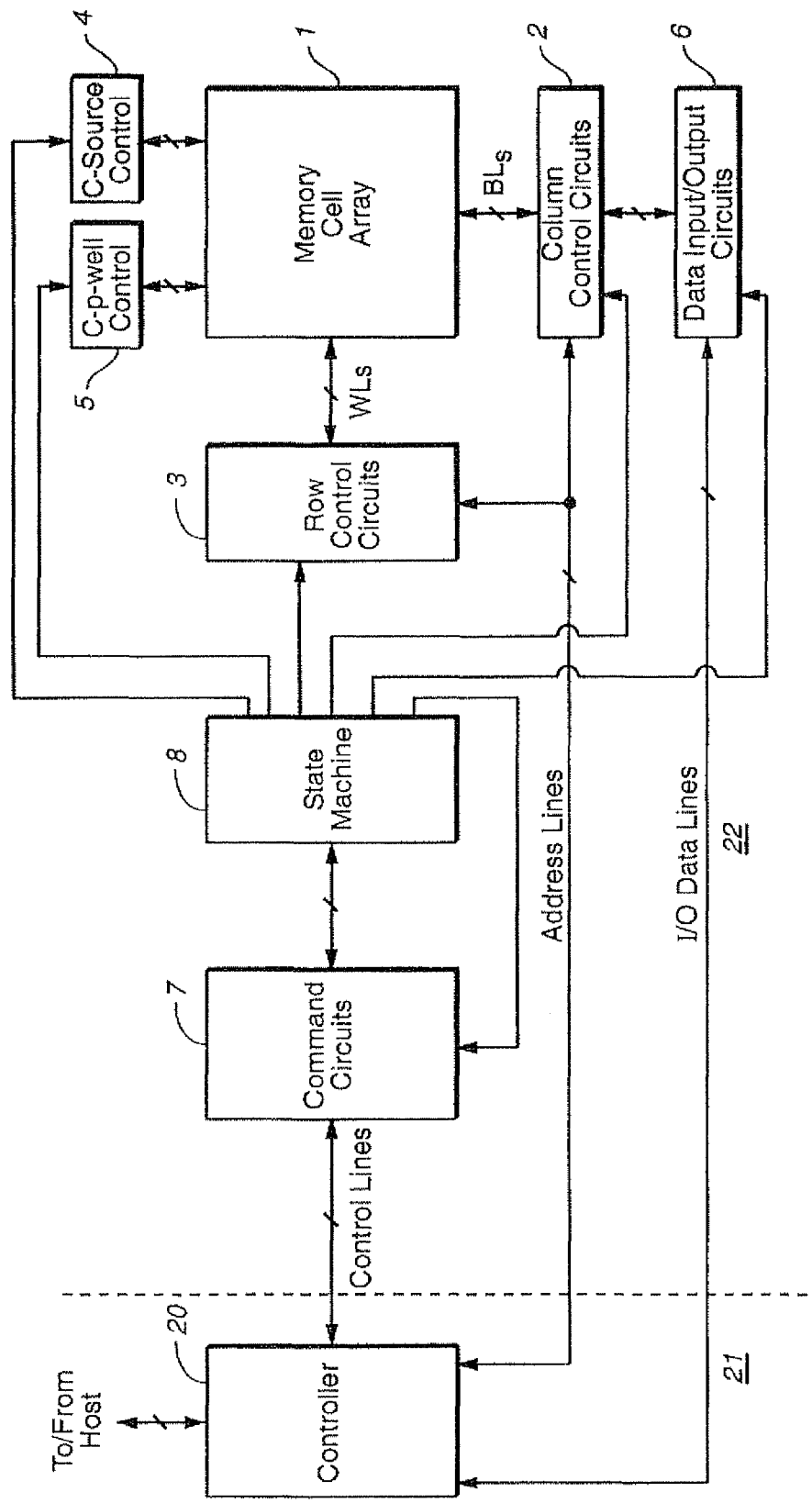
FIG. 10 is a high-level schematic block diagram of a flash memory device whose controller includes the decoder of FIG. 7A.

FIG. 10 is a high-level schematic block diagram of a flash memory device. A memory cell array 1 including a plurality of memory cells M arranged in a matrix is controlled by a column control circuit 2, a row control circuit 3, a c-source control circuit 4 and a c-p-well control circuit 5. Column control circuit 2 is connected to bit lines (BL) of memory cell array 1 for reading data stored in the memory cells (M), for determining a state of the memory cells (M) during a writing operation, and for controlling potential levels of the bit lines (BL) to promote the writing or to inhibit the writing. Row control circuit 3 is connected to word lines (WL) to select one of the word lines (WL), to apply read voltages, to apply writing voltages combined with the bit line potential levels controlled by column control circuit 2, and to apply an erase voltage coupled with a voltage of a p-type region on which the memory cells (M) are formed. C-source control circuit 4 controls a common source line connected to the memory cells (M). C-p-well control circuit 5 controls the c-p-well voltage.

The data stored in the memory cells (M) are read out by column control circuit 2 and are output to external I/O lines via an I/O line and a data input/output buffer 6. Program data to be stored in the memory cells are input to data input/output buffer 6 via the external I/O lines, and are transferred to column control circuit 2. The external I/O lines are connected to a controller 20.

Command data for controlling the flash memory device are input to a command interface connected to external control lines which are connected with controller 20. The command data inform the flash memory of what operation is requested. The input command is transferred to a state machine 8 that controls column control circuit 2, row control circuit 3, c-source control circuit 4, c-p-well control circuit 5 and data input/output buffer 6. State machine 8 can output a status data of the flash memory such as READY/BUSY or PASS/FAIL.

Controller 20 is connected or connectable with a host system such as a personal computer, a digital camera, a personal digital assistant. It is the host which initiates commands, such as to store or read data to or from the memory array 1, and provides or receives such data, respectively. Controller 20 converts such commands into command signals that can be interpreted and executed by command circuits 7. Controller 20 also typically contains buffer memory for the user data being written to or read from the memory array. A typical memory device includes one integrated circuit chip 21 that includes controller 20, and one or more integrated circuit chips 22 that each contain a memory array and associated control, input/output and state machine circuits. The trend, of course, is to integrate the memory array and controller circuits of such a device together on one or more integrated circuit chips. The memory device may be embedded as part of the host system, or may be included in a memory card that is removably insertable into a mating socket of host systems. Such a card may include the entire memory device, or the controller and memory array, with associated peripheral circuits, may be provided in separate cards.

Figure 11:
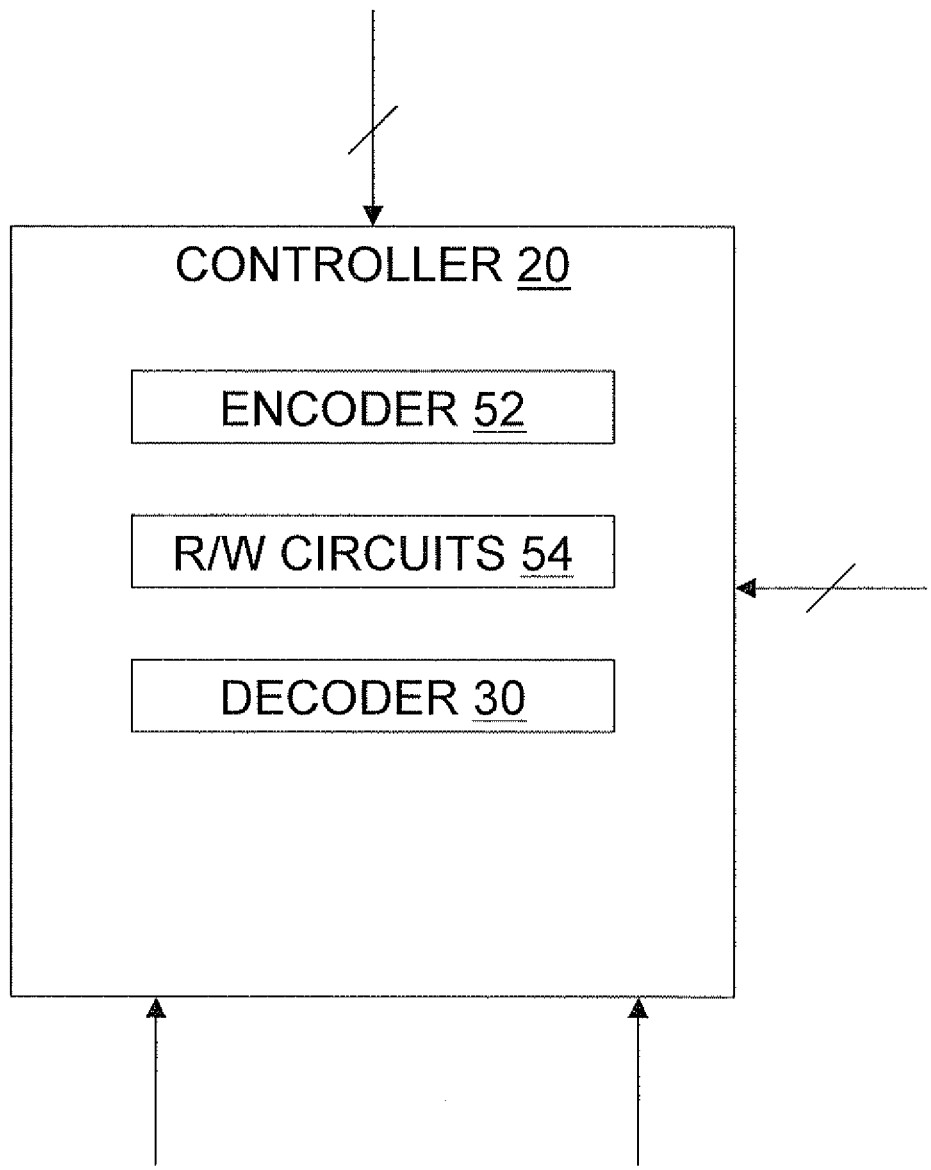
FIG. 11 is a detail of FIG. 10.

FIG. 11 is an enlarged view of part of FIG. 10, showing that controller 20 includes an encoder 52 for encoding user data received from the host as one or more codewords, circuitry 54 for instructing command circuits 7 to store the codewords (or only the non-punctured bits thereof, if any of the bits of the codewords are punctured bits) in memory cell array 1 and for instructing command circuits 7 to retrieving the stored codewords (or the stored portions thereof in the punctured bit case) from memory cell array 1, and decoder 30 for decoding the representation of the codewords as retrieved by circuitry 54. Alternatively, controller 20 could include decoder 31 instead of decoder 30.

Although the methods and the decoders disclosed herein are intended primarily for use in data storage systems, these methods and decoders also are applicable to communications systems, particularly communications systems that rely on wave propagation through media that strongly attenuate high frequencies. Such communication is inherently slow and noisy. One example of such communication is radio wave communication between shore stations and submerged submarines.

Figure 12:
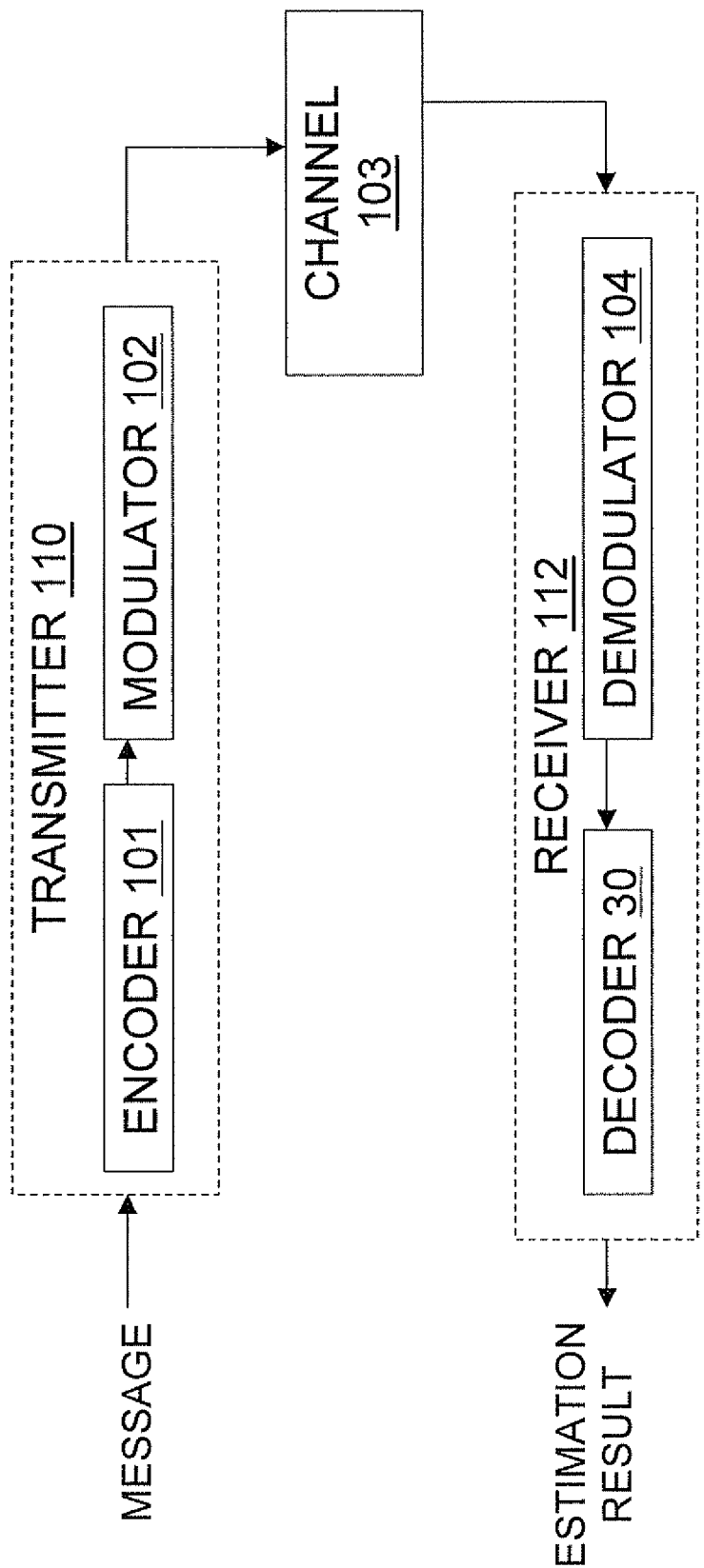
FIG. 12 is a high-level schematic block diagram of a communication system whose receiver includes the decoder of FIG. 7A.

FIG. 12 is a high-level schematic block diagram of a communication system 100 that includes a transmitter 110, a channel 103 and a receiver 112. Transmitter 110 includes an encoder 101 and a modulator 102. Receiver 112 includes a demodulator 104 and decoder 30. Encoder 101 receives a message and generates a corresponding codeword. Modulator 102 subjects the generated codeword to a digital modulation such as BPSK, QPSK or multi-valued QAM and transmits the resulting modulated signal to receiver 12 via channel 103. At receiver 112, demodulator 104 receives the modulated signal from channel 103 and subjects the received modulated signal to a digital demodulation such as BPSK, QPSK or multi-valued QAM. Decoder 30 decodes the resulting representation of the original codeword as described above. Alternatively, receiver 112 could include decoder 31 instead of decoder 30.

Turning now to the issue of trapping sets, there are two types of conventional methods for overcoming trapping sets in LDPC decoding:

1. Avoid trapping sets by designing LDPC codes without trapping sets.
2. Overcome trapping sets by algorithmic means during decoding.

The first type of conventional methods has the following disadvantages:

Since trapping sets are not well-defined, and long LDPC codes are quite complex, designing a graph with a low error floor, and proving that the error floor is low, may be a difficult task that requires extensive simulations. Moreover, such an approach may exclude the use of some LDPC codes that exhibit good properties with respect to other aspects, such as implementation complexity in encoding/decoding schemes, decoding speed and flexibility.

As for the second type of conventional methods, using algorithmic methods during decoding for overcoming trapping sets:

Several suggested methods are mentioned in the literature:
1. Averaging.
2. Informed Dynamic Scheduling
3. Identifying the trapping set and designing a custom sum-product Algorithm trying to avoid them.

1. The averaging method uses an update algorithm for the bit values. The updates are based, not only on the results of the preceding iteration, but on averages over the results of a few iterations. Several averaging methods have been suggested including arithmetic averaging, geometric averaging, and a weighted arithmetic geometric average Averaging has been described as a special case of message damping, whose origins can be found in statistical physics and dynamic systems. Specifically, it is well known that BP decoding is a special instance of the Bethe-Kikuchi method for estimating the Boltzmann distribution of an appropriately defined thermodynamical system.

The stability of the Bethe-Kikuchi method can be improved by probability damping. Damping can be performed in several different ways, including arithmetic averaging, geometric averaging, and normalization.

Several explanations have been proposed for the improvement in the convergence of the decoding that is provided by damping. Among these explanations are:

I. Averaging may be viewed as a means of controlling the oscillations in such a system.

II. Averaging also may be viewed as a method for controlling the speed with which extrinsic information is passed from one variable node to another.

III. Finally, averaging represents a way to combine "expert opinions" from various sub-graphs of the Tanner graph.

Although it has been claimed that damping methods improve the decoding performance, the complexity associated with such methods is prohibitive in the context of flash memory technology.

Message damping by a fixed normalization constant is at the other extreme. It is easy to implement, but does not achieve a significant improvement in performance.

2. Informed Dynamic Scheduling. In this method, not all check nodes are updated at each iteration but rather the next check node to be updated is selected based on the current state of the messages in the graph. The check node is selected based on a metric that measures how useful that check node update is to the decoding process. For each check node, the metric is the largest approximate residual of the check-to-variable messages that are generated in the check node. (A residual is the norm (defined over the message space) of the difference between the values of the message before and after an update.) This method is also complex since all check nodes need to be computed prior to selecting the nodes to be updated.

Both methods can achieve improvement in the error floor, but the associated complexity of the algorithms is high, since averaging requires storing a history of previous messages, and Informed Dynamic Scheduling incurs high computational complexity.

Methods of the third type require identification of the trapping set and a tailor-made algorithm for each graph, which limit their usage to specific scenarios, especially when multiple LDPC codes are considered in the same application.

A fourth method, that enhances the performance of LDPC decoding without increasing the complexity, is the reset method, which is the subject of a co-pending patent application.

The reset method is applied after detecting a failure of ordinary LDPC decoding. Once a failure is detected, the internal decoder state is reset to 0 (i.e. all the edge messages are reset to 0), and decoding is begun again starting from initial bit estimates that are a function of the final bit estimates of the ordinary decoding. This provides a flow of information from outside the trapping set into the trapping set, without the bias generated by the previous decoder state.

The new method that now will be described complements the reset method with another low complexity and efficient algorithm for overcoming trapping sets.

According to the new method, during each iteration of the decoder a kind of adaptive damping is implemented in which the bit reliability measures generated by the Belief Propagation (BP) decoder (or by any other decoder) are changed in order to improve the performance of the decoder when applied to a specific finite length code. The new method therefore increases the coding gain and reduces the error floor.

The conventional methods described above correct the BP computation rules, which assume statistical independence of incoming node messages. This assumption is valid when the local graph neighborhood involved in the computation of the specific message (referred to as the computation tree of the message) is cycle free and the initial decoder inputs are statistically independent. However, for good short and moderate block length codes, the underlying graph is cyclic and the BP computation rules are not optimal. In the new method it is believed that the decoder's computation rule of the message are corrected based on the specific (cyclic) graph structure of the code.

When computing a specific message, the sub-optimality of the conventional BP computation rule is due to the statistical dependencies of the messages involved in its computation. These statistical dependencies are "captured" in the computation tree of the message. The computation tree is a function of the specific edge over which the message is sent (having a specific graph neighborhood) and the specific iteration; this is the motivation for the use, in the new method, of edge-dependent and iteration-dependent damping rules as explained in further detail below.

The new method also reduces the error floor, since by correcting the BP computation rules, messages whose reliability is overestimated are damped. This in turn reduces the rate of convergence of the decoding algorithm and allows information from remote nodes to reach the trapping set nodes before the trapping set gets "locked" in an erroneous state.

According to the new method, during each iteration of the decoder in which damping is implemented, the estimates of the codeword bits, conveyed by the messages, are altered according to predefined rules, referred to herein as damping rules. These rules can be a function of the iteration number and/or the directed edge over which the message is transmitted. The damping rules are believed to depend on the specific structure of the code's underlying graph. More specifically, the damping rule used for a specific edge at a specific iteration is believed to be a function of the computation tree associated with the edge.

In a preferred implementation of the new method as applied to BP decoding with LLR messages, the predefined rules are implemented by multiplying the messages by appropriate damping factors. The damping factor of a message can be a function of the iteration number and/or of the directed edge over which the message is transmitted In this case the damping factors can be determined empirically, by studying the graph structure (offline), as described below.

In the preferred implementation, the damping factors are computed as a function of the iteration number, or as a function of the specific directed edge over which a message is transmitted, or as a function of the specific node from which a message is transmitted, or as a function of all of these parameters.

Moreover, optimal damping factors can be computed as an offline computation and stored in a lookup table. During real-time decoding the complexity of computing the damping factors is reduced to reading them from a pre-computed table.

Assume BP decoding with Log Likelihood Ratio (LLR) messages. Consider an LLR message T sent over edge e at iteration l. Assuming the LLR represents an accurate a-posteriori bit estimate, (as in the cycle free case), then:

$$|L| = \log\frac{1-p}{p} \qquad (7)$$

where p is the probability that the message is erroneous. Thus:

$$p = \frac{1}{1 + e^{|L|}} \qquad (8)$$

For transmission of a code word of all zeros this implies:

$$P_r(L < 0) = E[p] = E\left[\frac{1}{1 + e^{|L|}}\right] \qquad (9)$$

However, in a cyclic graph the equality might not hold, i.e. the expected message error rate reflected by the magnitude of the messages does not correspond to the actual error rate of the messages. Therefore a damping factor $\alpha_e^l$ is computed such that the following equality holds:

$$P_r(L < 0) = E\left[\frac{1}{1 + e^{|\alpha_e^l L|}}\right] \qquad (10)$$

In equation (10), $\alpha_e^l$ is the damping factor associated with edge e at iteration l. The error rate of the message, $P_r(L<0)$, can be measured empirically by transmitting an all-zero code word multiple times over the channel. If the "channel" is a memory such as a flash memory, the noise added to an all-zero codeword by storing the codeword and reading the codeword is simulated. With Pr(L<0) having been measured, the value of $\alpha_e^l$ that satisfies equation (10) is determined. For high signal-to-noise ratio and/or advanced iterations where a direct measurement of the probability $P_r(L<0)$ may be difficult to measure (too small to measure directly), we can use an approximate approach in order to determine the damping factor. Assuming L is a consistent Gaussian variable, (which is reasonable especially for variable to check messages), it can be shown that the damping factor is given by:

$$\alpha_e^l = \frac{2\mu_L}{\sigma_l^2} \quad (11)$$

Here the mean $\mu_L$ and the standard deviation $\sigma_l$ can be easily evaluated at any signal-to-noise-ratio conditions as follows:

$$\mu_L = E[L], \; \sigma_l^2 = E[(L-\mu_L)^2] \quad (12)$$

Therefore empirically (via simulation) we measure L, the LLR on edge 'e' at iteration 'l' then $\mu_L$ are $\sigma_l$ are derived according to equation (12), from which $\alpha_e^l$ is obtained using equation (11).

Normally, exhaustive simulations that require processing large amount data are needed; however as the simulation is done offline the large amount of required processing does not restrict the applicability of the new method.

For example, assuming that graph 'G' has 1000 edges, that the number of iterations is 10, and that the number of LLR samples measured per edge in order to estimate $\mu_L$ and $\sigma_l$ is u=1000 then the database includes $10^7$ LLR elements. For this example $\mu_L$ and $\sigma_l$ are computed as follows:

$$\mu_L = E[L] = \frac{1}{u} \cdot \sum_{i=1}^{u} L_i,$$

$$\sigma_l^2 = E[(L-\mu_L)^2] = \frac{1}{u} \cdot \sum_{i=1}^{u} (L_i - \mu_L)^2 \quad (13)$$

In addition to damping messages that are exchanged between nodes, or alternatively to damping messages that are exchanged between nodes, damping may be applied to values associated with nodes. The value associated with a bit node is the current estimate $Q_v$ of the LLR bit estimate at that bit node. A value can be associated with a bit node if equation (4) is expanded as follows:

$$S_v = \sum_{c' \in N(v,G)} R_{c'v}; \quad Q_{vc} = P_v + S_v - R_{cv} \quad (14)$$

$S_v$ then is the value associated with the bit node A value can be associated with a check node if equation (5) is expanded as follows:

$$T_c = \sum_{v' \in N(c,G)} \varphi(Q_{v'c}); \quad R_{cv} = \varphi^{-1}(T_c - \varphi(Q_{vc})) \quad (15)$$

$T_c$ then is the value associated with the check node. Damping factors for $S_v$ and $T_c$ are obtained similarly to how the damping factors $\alpha_e^l$ of messages are obtained, based on equations (7) through (12) with the understanding that p represents the probability that $S_v$ or $T_c$ is erroneous and that "e" indexes a node rather than an edge. Alternatively, the damping factor for a node is obtained by averaging the damping factors of the edges that are connected to the node.

The foregoing has described a limited number of embodiments of methods for decoding a representation of a codeword, of decoders that use these methods, of memories whose controllers include such decoders, and of communication systems whose receivers include such decoders. It will be appreciated that many variations, modifications and other applications of the methods, decoders, memories and systems may be made.

What is claimed is:

1. A method of decoding a representation of a target codeword that encodes K information bits as N codeword bits, wherein N and K are numerical integer values and K is less than N, the method comprising:
   (a) importing the representation of the codeword from a channel;
   (b) in a plurality of decoding iterations, updating estimates of the codeword bits by steps including, in a graph that includes N bit nodes and N−K check nodes, exchanging decoding messages between the bit nodes and the check nodes; and
   (c) in each of at least one of the decoding iterations, modifying, using at least one processor, at least a portion of decoding values selected from the group consisting of respective decoding bit node values associated with the bit nodes, respective decoding check node values associated with the check nodes, and the decoding messages, wherein the modifying depends explicitly on an ordinality of the each decoding iteration, and wherein the modifying is independent of decoding iterations other than the each decoding iteration.

2. The method of claim 1, wherein the at least portion of the decoding values is at least a portion of the decoding messages.

3. The method of claim 1, wherein the modifying is effected prior to testing for convergence of the updating of the estimates of the codeword bits.

4. The method of claim 1, wherein, if a decoding message is modified, the modifying depends on the bit node and the check node that exchange the decoding message.

5. The method of claim 1, wherein the modifying includes multiplying by a damping factor that is greater than zero and less than one.

6. The method of claim 1, wherein the modifying includes multiplying by a factor that is a function of the ordinality of the each decoding iteration.

7. The method of claim 1, wherein each decoding value that is modified is modified according to a respective rule, the method further comprising the step of:
   (d) calibrating the rules.

8. The method of claim 7, wherein the rules are calibrated by steps including:
   (i) exporting a plurality of instances of a calibration codeword to the channel;
   (ii) importing respective representations of the instances of the calibration codeword from the channel;
   (iii) for each representation of an instance of the calibration codeword: in a plurality of calibration iterations, exchanging calibration messages between the bit nodes and the check nodes; and
   (iv) for each decoding value that is modified: accumulating statistics of a corresponding calibration value, the rule according to which the each decoding value is modified then being based on the statistics of the corresponding calibration value.

9. The method of claim 8, wherein the calibration codeword is a codeword of N identical bits.

10. The method of claim 8, wherein, for each decoding value that is modified, the statistics of the corresponding calibration value include an estimated error rate of the corresponding calibration value.

11. The method of claim 8, wherein, for each decoding value that is modified, the statistics of the corresponding calibration value include a mean $\mu$ of the corresponding calibration value and a standard deviation $\sigma$ of the corresponding calibration value.

12. The method of claim 11, wherein, for each decoding value that is modified, the respective rule includes multiplication by $2\mu/\sigma^2$.

13. The method of claim 7, wherein the rules are calibrated by steps including:
   (i) simulating the exporting of a plurality of instances of a calibration codeword to the channel and the importing of respective representations of the instances of the calibration codeword from the channel;
   (ii) for each representation of an instance of the calibration codeword: in a plurality of calibration instances, exchanging calibration messages between the bit nodes and the check nodes; and
   (iii) for each decoding value that is modified: accumulating statistics of a corresponding calibration value, the rule according to which the each decoding value is modified then being based on the statistics of the corresponding calibration values.

14. The method of claim 13, wherein the calibration codeword is a codeword of N identical bits.

15. The method of claim 13, wherein, for each decoding value that is modified, the statistics of the corresponding calibration value include an estimated error rate of the corresponding calibration value.

16. The method of claim 13, wherein, for each decoding value that is modified, the statistics of the corresponding calibration value include a mean $\mu$ of the corresponding calibration value and a standard deviation $\sigma$ of the corresponding calibration value.

17. The method of claim 16, wherein, for each decoding value that is modified, the respective rule includes multiplication by $2\mu/\sigma^2$.

18. A method of decoding a representation of a target codeword that encodes K information bits as N codeword bits, wherein N and K are numerical integer values and K is less than N, the method comprising:
   (a) importing the representation of the codeword from a channel;
   (b) in a plurality of decoding iterations, updating estimates of the codeword bits by steps including, in a graph that includes N bit nodes and N−K check nodes, exchanging decoding messages between the bit nodes and the check nodes; and
   (e) in each of at least one of the decoding iterations, modifying, using at least one processor, at least a portion of decoding values, selected from the group consisting of respective decoding bit node values associated with the bit nodes, respective decoding check node values associated with the check nodes, and the decoding messages, in accordance with respective locally heteromorphic rules.

19. The method of claim 18, wherein the modifying is independent of decoding iterations other than the each decoding iteration.

20. The method of claim 18, wherein the at least portion of the decoding values is at least a portion of the decoding messages.

21. The method of claim 18, wherein the modifying is effected prior to testing for convergence of the updating of the estimates of the codeword bits.

22. The method of claim 18, wherein the modifying includes multiplying by a damping factor that is greater than zero and less than one.

23. The method of claim 18, wherein the modifying is a function of an ordinality of the each iteration.

24. The method of claim 18, further comprising the step of:
   (d) calibrating the rules.

25. The method of claim 24, wherein the rules are calibrated by steps including:
   (i) exporting a plurality of instances of a calibration codeword to the channel;
   (ii) importing respective representations of the instances of the calibration codeword from the channel;
   (iii) for each representation of an instance of the calibration codeword: in a plurality of calibration iterations, exchanging calibration messages between the bit nodes and the check nodes; and
   (iv) for each decoding value that is modified: accumulating statistics of a corresponding calibration value, the rule according to which the each decoding value is modified then being based on the statistics of the corresponding calibration values.

26. The method of claim 25, wherein the calibration codeword is a codeword of N identical bits.

27. The method of claim 25, wherein, for each decoding value that is modified, the statistics of the corresponding calibration value includes an estimated error rate of the corresponding calibration value.

28. The method of claim 25, wherein, for each decoding value that is modified, the statistics of the corresponding calibration value include a mean $\mu$ of the corresponding calibration value and a standard deviation $\sigma$ of the corresponding calibration value.

29. The method of claim 28, wherein, for each decoding value that is modified, the respective rule includes multiplication by $2\mu/\sigma^2$.

30. The method of claim 24, wherein the rules are calibrated by steps including:
   (i) simulating the exporting of a plurality of instances of a calibration codeword to the channel and the importing of respective representations of the instances of the calibration codeword from the channel;
   (ii) for each representation of an instance of the calibration codeword: in a plurality of calibration instances, exchanging calibration messages between the bit nodes and the check nodes; and
   (iii) for each decoding value that is modified: accumulating statistics of a corresponding calibration value, the rule according to which the each decoding value is modified then being based on the statistics of the corresponding calibration values.

31. The method of claim 30, wherein the calibration codeword is a codeword of N identical bits.

32. The method of claim 30, wherein, for each decoding value that is modified, the statistics of the corresponding calibration value includes an estimated error rate of the corresponding calibration value.

33. The method of claim 30, wherein, for each decoding value that is modified, the statistics of the corresponding calibration value include a mean µ of the corresponding calibration value and a standard deviation σ of the corresponding calibration value.

34. The method of claim 33, wherein, for each decoding value that is modified, the respective rule includes multiplication by $2\mu/\sigma^2$.

35. A decoder for decoding a representation of a codeword that encodes K information bits as N codeword bits, wherein N and K are numerical integer values and K is less than N, the decoder comprising a processor for decoding the representation of the codeword by executing an algorithm for updating estimates of the codeword by steps including:
(a) in a plurality of decoding iterations, updating estimates of the codeword bits by steps including, in a graph that includes N bit nodes and N–K check nodes, exchanging decoding messages between the bit nodes and the check nodes; and
(b) in each of at least one of the decoding iterations, modifying at least a portion of decoding values selected from the group consisting of respective decoding bit node values associated with the bit nodes, respective decoding check node values associated with the check nodes, and the decoding messages, wherein the modifying depends explicitly on an ordinality of the each decoding iteration, and wherein the modifying is independent of decoding iterations other than the each decoding iteration.

36. A decoder for decoding a representation of a codeword that encodes K information bits as N codeword bits, wherein N and K are numerical integer values and K is less than N, the decoder comprising a processor for decoding the representation of the codeword by executing an algorithm for updating estimates of the codeword by steps including:
(a) in a plurality of decoding iterations, updating estimates of the codeword bits by steps including, in a graph that includes N bit nodes and N–K check nodes, exchanging decoding messages between the bit nodes and the check nodes; and
(b) in each of at least one of the decoding iterations, modifying at least a portion of decoding values, selected from the group consisting of respective decoding bit node values associated with the bit nodes, respective decoding check node values associated with the check nodes, and the decoding messages, in accordance with respective locally heteromorphic rules.

37. A memory controller comprising:
(a) an encoder for encoding K information bits as a codeword of N codeword bits, wherein N and K are numerical integer values and K is less than N; and
(b) a decoder including a processor for decoding a representation of the codeword by executing an algorithm for updating estimates of the codeword by steps including:
(i) in a plurality of decoding iterations, updating estimates of the codeword bits by steps including, in a graph that includes N bit nodes and N–K check nodes, exchanging decoding messages between the bit nodes and the check nodes, and
(ii) in each of at least one of the decoding iterations, modifying at least a portion of decoding values selected from the group consisting of respective decoding bit node values associated with the bit nodes, respective decoding cheek node values associated with the check nodes, and the decoding messages, wherein the modifying depends explicitly on an ordinality of the each decoding iteration, and wherein the modifying is independent of decoding iterations other than the each decoding iteration.

38. The memory controller of claim 37, further comprising:
(c) circuitry for storing at least a portion of the codeword in a main memory and for retrieving the representation of the at least portion of the codeword from the main memory.

39. A memory device comprising:
(a) the memory controller of claim 38; and
(b) the main memory.

40. A memory controller comprising:
(a) an encoder for encoding K information bits as a codeword of N codeword bits, wherein N and K are numerical integer values and K is less than N; and
(b) a decoder including a processor for decoding a representation of the codeword by executing an algorithm for updating estimates of the codeword by steps including:
(i) in a plurality of decoding iterations, updating estimates of the codeword bits by steps including, in a graph that includes N bit nodes and N–K check nodes, exchanging decoding messages between the bit nodes and the check nodes, and
(ii) in each of at least one of the decoding iterations, modifying at least a portion of decoding values, selected from the group consisting of respective decoding bit node values associated with the bit nodes, respective decoding check node values associated with the check nodes, and the decoding messages, in accordance with respective locally heteromorphic rules.

41. The memory controller of claim 40, further comprising:
(c) circuitry for storing at least a portion of the codeword in a main memory and for retrieving the representation of the at least portion of the codeword from the main memory.

42. A memory device comprising:
(a) the memory controller of claim 41; and
(b) the main memory.

43. A method of decoding a representation of a codeword that encodes K information bits as N codeword bits, wherein N and K are numerical integer values and K is less than N, the method comprising:
(a) importing the representation of the codeword from a channel;
(b) providing a parity check matrix having N–K rows and N columns;
(c) in a plurality of decoding iterations, updating estimates of the codeword bits by steps including exchanging messages between the rows and the columns of the matrix; and
(d) in each of at least one of the decoding iterations, modifying, using at least one processor, at least a portion of values selected from the group consisting of respective row values associated with the rows of the matrix, respective column values associated with the columns of the matrix, and the messages, wherein the modifying depends explicitly on an ordinality of the each decoding iteration, and wherein the modifying is independent of decoding iterations other than the each decoding iteration.

44. A method of decoding a representation of a codeword that encodes K information bits as N codeword bits, wherein N and K are numerical integer values and K is less than N, the method comprising:

(a) importing the representation of the codeword from a channel;
(b) providing a parity check matrix having N−K rows and N columns;
(c) in a plurality of decoding iterations, updating estimates of the codeword bits by steps including exchanging messages between the rows and the columns; and
(d) in each of at least one of the decoding iterations, modifying, using at least one processor, at least a portion of values, selected from the group consisting of respective row values associated with the rows of the matrix, respective column values associated with the columns of the matrix, and the messages, in accordance with respective locally heteromorphic rules.

45. A decoder for decoding a representation of a codeword that encodes K information bits as N codeword bits, wherein N and K are numerical integer values and K is less than N, the decoder comprising a processor for decoding the representation of the codeword by executing an algorithm for updating estimates of the codeword by steps including:
(a) providing a parity check matrix having N−K rows and N columns;
(b) in a plurality of decoding iterations, updating estimates of the codeword bits by steps including exchanging messages between the rows and the columns; and
(c) in each of at least one of the decoding iterations, modifying at least a portion of values selected from the group consisting of respective row values associated with the rows of the matrix, respective column values associated with the columns of the matrix, and the messages, wherein the modifying depends explicitly on an ordinality of the each decoding iteration, and wherein the modifying is independent of decoding iterations other than the each decoding iteration.

46. A decoder for decoding a representation of a codeword that encodes K information bits as N codeword bits, wherein N and K are numerical integer values and K is less than N, the decoder comprising a processor for decoding the representation of the codeword by executing an algorithm for updating estimates of the codeword by steps including:
(a) providing a parity check matrix having N−K rows and N columns;
(b) in a plurality of decoding iterations, updating estimates of the codeword bits by steps including exchanging messages between the rows and the columns; and
(c) in each of at least one of the decoding iterations, modifying at least a portion of values, selected from the group consisting of respective row values associated with the rows of the matrix, respective column values associated with the columns of the matrix, and the messages, in accordance with respective locally heteromorphic rules.

47. A memory controller comprising:
(a) an encoder for encoding K information bits as a codeword of N codeword bits, wherein N and K are numerical integer values and K is less than N; and
(b) a decoder including a processor for decoding a representation of the codeword by executing an algorithm for updating estimates of the codeword by steps including:
  (i) providing a parity check matrix having N−K rows and N columns;
  (ii) in a plurality of decoding iterations, updating estimates of the codeword bits by steps including exchanging messages between the rows and the columns, and
  (iii) in each of at least one of the decoding iterations, modifying at least a portion of values selected from the group consisting of respective row values associated with the rows of the matrix, respective column values associated with the columns of the matrix, and the messages, wherein the modifying depends explicitly on an ordinality of the each decoding iteration, and wherein the modifying is independent of decoding iterations other than the each decoding iteration.

48. The memory controller of claim 47, further comprising:
(c) circuitry for storing at least a portion of the codeword in a main memory and for retrieving a representation of the at least portion of the codeword from the main memory.

49. A memory controller comprising:
(a) an encoder for encoding K information bits as a codeword of N codeword bits, wherein N and K are numerical integer values and K is less than N; and
(b) a decoder including a processor for decoding a representation of the codeword by executing an algorithm for updating estimates of the codeword by steps including:
  (i) providing a parity check matrix having N−K rows and N columns;
  (ii) in a plurality of decoding iterations, updating estimates of the codeword bits by steps including exchanging messages between the rows and the columns; and
  (iii) in each of at least one of the decoding iterations, modifying at least a portion of values, selected from the group consisting of respective row values associated with the rows of the matrix, respective column values associated with the columns of the matrix, and the messages, in accordance with respective locally heteromorphic rules.

50. The memory controller of claim 49, further comprising:
(c) circuitry for storing at least a portion of the codeword in a main memory and for retrieving a representation of the at least portion of the codeword from the main memory.

51. A memory device comprising:
(a) the memory controller of claim 50; and
(b) the main memory.

* * * * *